US011626780B2

(12) United States Patent
Kabune

(10) Patent No.: US 11,626,780 B2
(45) Date of Patent: Apr. 11, 2023

(54) ELECTRONIC CONTROL DEVICE

(71) Applicant: DENSO CORPORATION, Kariya (JP)

(72) Inventor: Hideki Kabune, Kariya (JP)

(73) Assignee: DENSO CORPORATION, Kariya (JP)

( * ) Notice: Subject to any disclaimer, the term of this patent is extended or adjusted under 35 U.S.C. 154(b) by 393 days.

(21) Appl. No.: 16/835,790

(22) Filed: Mar. 31, 2020

(65) Prior Publication Data

US 2020/0321840 A1 Oct. 8, 2020

(30) Foreign Application Priority Data

Apr. 2, 2019 (JP) .............................. JP2019-070426

(51) Int. Cl.
| | | |
|---|---|---|
| *H02K 11/40* | (2016.01) | |
| *H05K 5/00* | (2006.01) | |
| *H02K 11/33* | (2016.01) | |
| *H03K 19/0948* | (2006.01) | |
| *B62D 5/04* | (2006.01) | |

(52) U.S. Cl.
CPC .............. *H02K 11/40* (2016.01); *B62D 5/04* (2013.01); *B62D 5/0481* (2013.01); *B62D 5/0487* (2013.01); *H02K 11/33* (2016.01); *H03K 19/0948* (2013.01); *H05K 5/0017* (2013.01); *B62D 5/0412* (2013.01)

(58) Field of Classification Search
CPC .......... H02K 11/40; H02K 11/33; B62D 5/04; B62D 5/0481; B62D 5/0487; B62D 5/0412; H03K 19/0948; H05K 5/0017
See application file for complete search history.

(56) References Cited

U.S. PATENT DOCUMENTS

| | | | |
|---|---|---|---|
| 2014/0265959 A1* | 9/2014 | Fuse | .................... H02H 7/0844 318/400.21 |
| 2017/0217481 A1 | 8/2017 | Asao et al. | |
| 2017/0272009 A1 | 9/2017 | Kawamura et al. | |
| 2017/0291635 A1 | 10/2017 | Yamasaki | |
| 2019/0097453 A1* | 3/2019 | Saito | ....................... B60R 16/02 |
| 2019/0126973 A1 | 5/2019 | Yamasaki | |
| 2020/0317258 A1 | 10/2020 | Nakamura et al. | |

(Continued)

FOREIGN PATENT DOCUMENTS

| | | |
|---|---|---|
| JP | S63-82121 A | 4/1988 |
| JP | H07-112817 A | 5/1995 |

(Continued)

OTHER PUBLICATIONS

Translation of JP2017099170 has been attached.*
Translation of JPH07112817 has been attached.*
Translation of JP2008026010 has been attached.*

*Primary Examiner* — Zoheb S Imtiaz
(74) *Attorney, Agent, or Firm* — Maschoff Brennan

(57) ABSTRACT

An electronic control device includes a plurality of control circuit units, a signal line, and a sneak-in suppression circuit. The plurality of control circuit units are connected to separate grounds, respectively. The signal line connects a first control circuit unit and a second control circuit unit. When a system is defined as a combination of a component and a ground corresponding to a control circuit unit, the sneak-in suppression circuit suppresses a sneak-in of electric power from the ground of one system (i.e., a subject system) to the other system connected by the signal line for preventing a cascading failure.

20 Claims, 16 Drawing Sheets

(56) References Cited

U.S. PATENT DOCUMENTS

2020/0321769 A1   10/2020  Nakamura et al.
2021/0046973 A1*  2/2021  Koseki .................. H02P 29/028

FOREIGN PATENT DOCUMENTS

| JP | H07112817 | * | 5/1995 |
| JP | 2008-026010 A | | 2/2008 |
| JP | 2008026010 | * | 2/2008 |
| JP | 2017-099170 A | | 6/2017 |
| JP | 2017099170 | * | 6/2017 |
| JP | 2017-169405 A | | 9/2017 |
| JP | 2017-189033 A | | 10/2017 |
| JP | 6223593 A | | 11/2017 |
| JP | 2018-042403 A | | 3/2018 |

\* cited by examiner

ELECTRONIC CONTROL DEVICE

CROSS REFERENCE TO RELATED APPLICATION

The present application is based on and claims the benefit of priority of Japanese Patent Application No. 2019-070426, filed on Apr. 2, 2019, the disclosure of which is incorporated herein by reference.

TECHNICAL FIELD

The present disclosure generally relates to an electronic control device.

BACKGROUND INFORMATION

The related art includes a driving device used for an electric power steering apparatus.

In the related art, for information communication between two systems, for example, microcomputers may be connected by using a signal line. In such case, when a ground is separated, i.e., separately provided, for each system, if there is a difference caused between the ground potentials of the two systems, a sneak current is generated (i.e., flows) via the signal line and a parasitic diode in the circuit. Further, for example, when an abnormality occurs in a part of (e.g., one of) the ground potentials, the sneak current generated by the ground abnormality may further causes a failure in a normal system, which may be designated as a cascading failure.

SUMMARY OF THE INVENTION

It is an object of the present disclosure to provide an electronic control device capable of suppressing a sneak-in electric power from a ground of other system.

BRIEF DESCRIPTION OF THE DRAWINGS

Objects, features, and advantages of the present disclosure will become more apparent from the following detailed description made with reference to the accompanying drawings, in which.

DETAILED DESCRIPTION

First Embodiment

Figure 1:
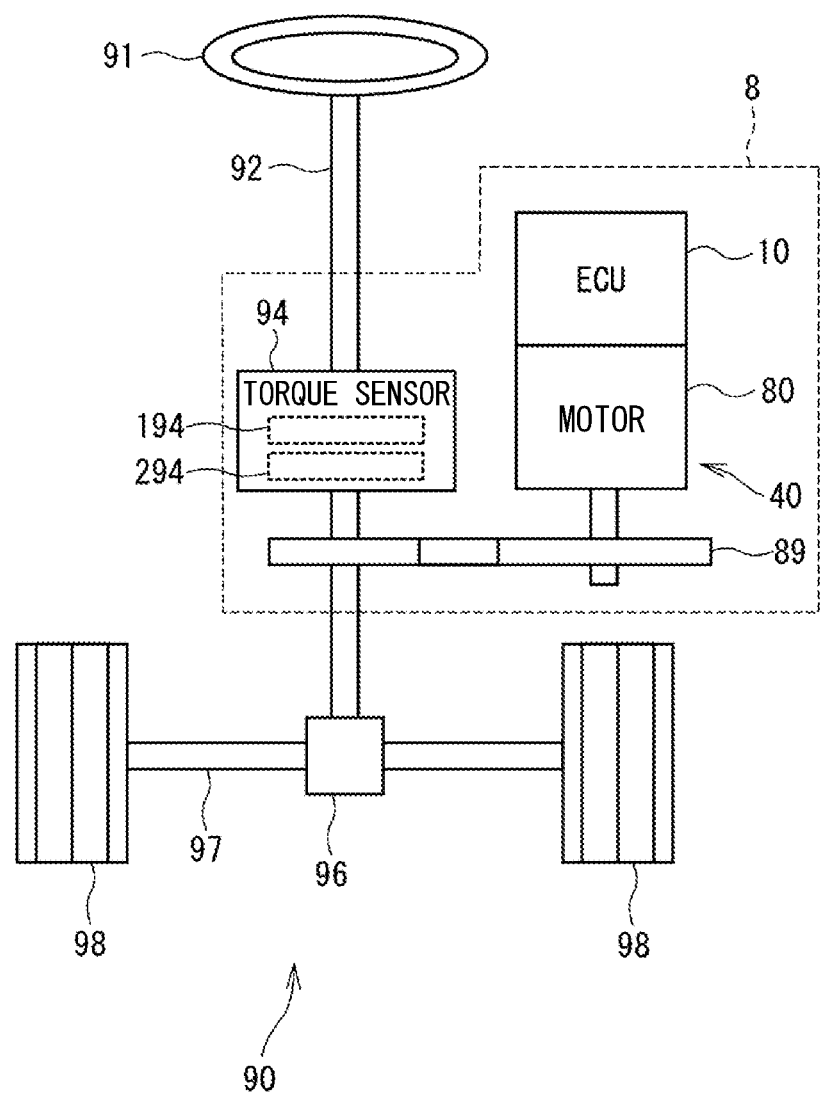
FIG. 1 is a schematic configuration diagram of a steering system including a driving device according to a first embodiment.

Hereinafter, an electronic control device according to the present disclosure will be described with reference to the drawings. In a plurality of embodiments below, a substantially identical component is designated by the same reference numeral to eliminate duplicate description.

The first embodiment is illustrated in FIGS. 1 to 6. As shown in FIG. 1, an ECU 10 as an electronic control device is a motor control device that controls driving of a motor 80 that is a rotating electrical machine, and the ECU 10 together with the motor 80, for example, is applied to an electric power steering apparatus 8 for assisting steering operation of a vehicle.

FIG. 1 shows a configuration of a steering system 90 including the electric power steering apparatus 8. The steering system 90 includes a steering wheel 91 which is a steering member, a steering shaft 92, a pinion gear 96, a rack shaft 97, road wheels 98 and the electric power steering apparatus 8.

The steering wheel 91 is connected to the steering shaft 92. A torque sensor 94 is provided on the steering shaft 92 to detect a steering torque. The torque sensor 94 has a first sensor unit 194 and a second sensor unit 294, and each sensor capable of detecting its own failure is duplicated. The pinion gear 96 is provided at an axial end of the steering shaft 92. The pinion gear 96 engages with the rack shaft 97. A pair of road wheels 98 is coupled at both ends of the rack shaft 97 via, for example, tie rods.

When a driver of the vehicle rotates the steering wheel 91, the steering shaft 92 connected to the steering wheel 91 rotates. A rotational movement of the steering shaft 92 is converted to a linear movement of the rack shaft 97 by the pinion gear 96. The pair of road wheels 98 is steered to an angle corresponding to the displacement amount of the rack shaft 97.

The electric power steering apparatus 8 includes the motor 80, a speed reduction gear 89, the ECU 10 and the like. The speed reduction gear 89 is a power transmission mechanism that reduces the rotation speed of the motor 80 and transmits the reduced number of rotations to the steering shaft 92. The electric power steering apparatus 8 of the present embodiment is a so-called "column assist type." However, it may alternatively be a "rack assist type" that transmits the rotation of the motor 80 to the rack shaft 97. In the present embodiment, the steering shaft 92 is a drive object.

Figure 2:
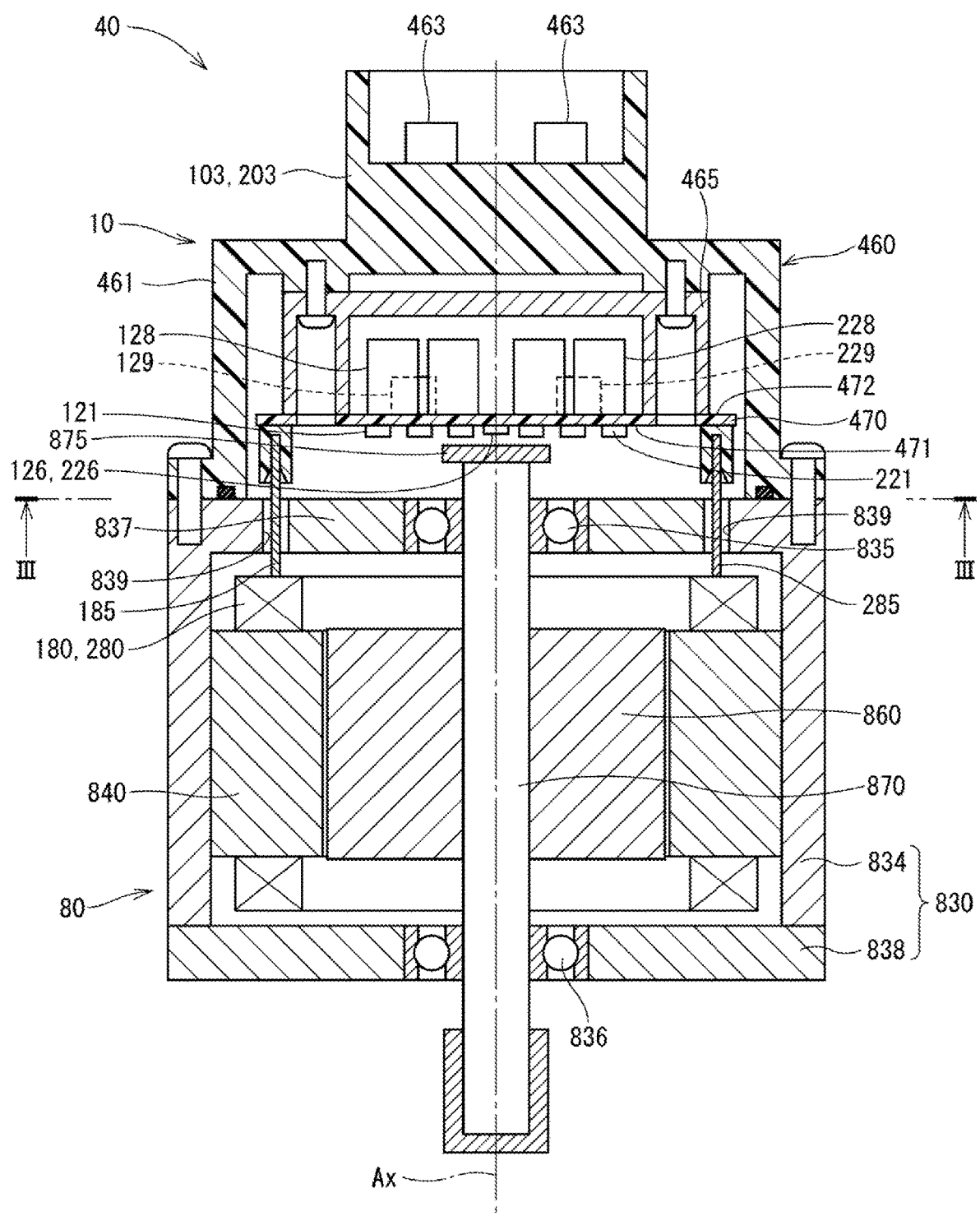
FIG. 2 is a cross-sectional view of the driving device according to the first embodiment.

As shown in FIG. 1 to FIG. 4, the motor 80 outputs a whole or a part of an assist torque required for a steering operation. The motor 80 is driven by electric power supplied from batteries 101 and 201 provided as direct current power supplies to rotate the speed reduction gear 89 in forward and backward directions. The motor 80 is a three-phase brushless motor and has a rotor 860 and a stator 840 as shown in FIG. 2.

The motor 80 has a first motor winding 180 and a second motor winding 280 respectively as a winding set. The motor windings 180 and 280 have the same electrical characteristics and are wound about the stator 840 with electrical angles shifted from each other by 30 degrees. Correspondingly, phase currents are controlled to be supplied to the motor windings 180 and 280 such that the phase currents have a phase difference φ of 30 degrees. By optimizing a current supply phase difference, the output torque is improved. In addition, sixth-order torque ripple can be reduced, thereby reducing noise and vibration accompanying the rotation of the motor 80. In addition, since heat is distributed and leveled by the distribution of the electric current among the two sets of motor winding, it is possible to reduce temperature-dependent system errors such as a detection value of each sensor and a torque, while increasing the amount of suppliable electric current to each of the winding sets. Note that the motor windings 180 and 280 may have different electrical characteristics.

Hereinafter, a combination of a first inverter unit 120 and a first control circuit unit 150 and the like, which are related to the driving control for the first motor winding 180, will be referred to as a first system L1 and a combination of a second inverter unit 220 and a second control circuit unit 250 and the like, which are related to the driving control for the second motor winding 280, is referred to as a second system L2. The configuration related to the first system L1 is basically indicated with reference numerals of 100, and the configuration related to the second system L2 is basically indicated with reference numerals of 200. In the first system L1 and the second system L2, same or similar configuration is indicated with same reference numeral in the least significant two digits. For the other configuration described below, the term "first" is indicated with a suffix "1," and the term "second" is indicated with a suffix "2."

In a driving device 40, the ECU 10 is integrally provided on one side in the axial direction of the motor 80 in one body, which bears a name of a machine-electronics integrated type. However, the motor 80 and the ECU 10 may alternatively be provided separately. The ECU 10 is positioned coaxially with an axis Ax of the shaft 870 on the side opposite to an output shaft of the motor 80. The ECU 10 may alternatively be provided on the output shaft side of the motor 80. By adopting the machine-electronics integrated type arrangement, it is possible to efficiently arrange the ECU 10 and the motor 80 in a vehicle having restricted mounting space.

The motor 80 includes the stator 840, the rotor 860 and a housing 830 which houses the stator 840 and the rotor 860 therein, together with other parts. The stator 840 is fixed to the housing 830 and the motor windings 180 and 280 are wound thereon. The rotor 860 is provided radially inside the stator 840 to be rotatable relative to the stator 840.

The shaft 870 is fitted in the rotor 860 to rotate integrally with the rotor 860. The shaft 870 is rotatably supported by the housing 830 by using bearings 835 and 836. An end portion of the shaft 870 on the ECU 10 side protrudes from the housing 830 toward the ECU 10. A magnet 875 is provided at the axial end of the shaft 870 on the ECU 10 side.

The housing 830 has a bottomed cylindrical case 834, which has a rear frame end 837, and a front frame end 838 provided on an open side of the case 834. The case 834 and the front frame end 838 are fastened to each other by bolts or the like. Lead wire insertion holes 839 are formed in the rear frame end 837. Lead wires 185 and 285 connected to each phase of the motor windings 180 and 280 are inserted through the lead wire insertion holes 839. The lead wires 185 and 285 are taken out from the lead wire insertion holes 839 toward the ECU 10 and connected to a circuit board 470.

The ECU 10 includes a cover 460 and a heat sink 465 fixed to the cover 460 in addition to the circuit board 470 fixed to the heat sink 465. The ECU 10 further includes various electronic components and the like mounted on the circuit board 470.

The cover 460 protects the electronic components from external impacts and prevents dust, water or the like from entering into the ECU 10. In the cover 460, a cover main body 461 and connector units 103 and 203 are integrally formed. The connector units 103 and 203 may alternatively be separate from the cover main body 461. Terminals 463 of the connector units 103 and 203 are connected to the circuit board 470 via wirings (not shown) or the like. The number of connectors and the number of terminals may be changed in correspondence to the number of signals and the like. The connector units 103 and 203 are provided at an end portion in the axial direction of the driving device and is open on one side opposite to the motor 80.

The circuit board 470 is, for example, a printed circuit board, and is positioned to face the rear frame end 837. On the circuit board 470, the electronic components of the first and second systems are mounted independently for each system so that the two systems are provided in a fully-redundant configuration. According to the present embodiment, the electronic components are mounted on one circuit board 47. However, the electronic components may alternatively be mounted on plural circuit boards.

Figure 3:
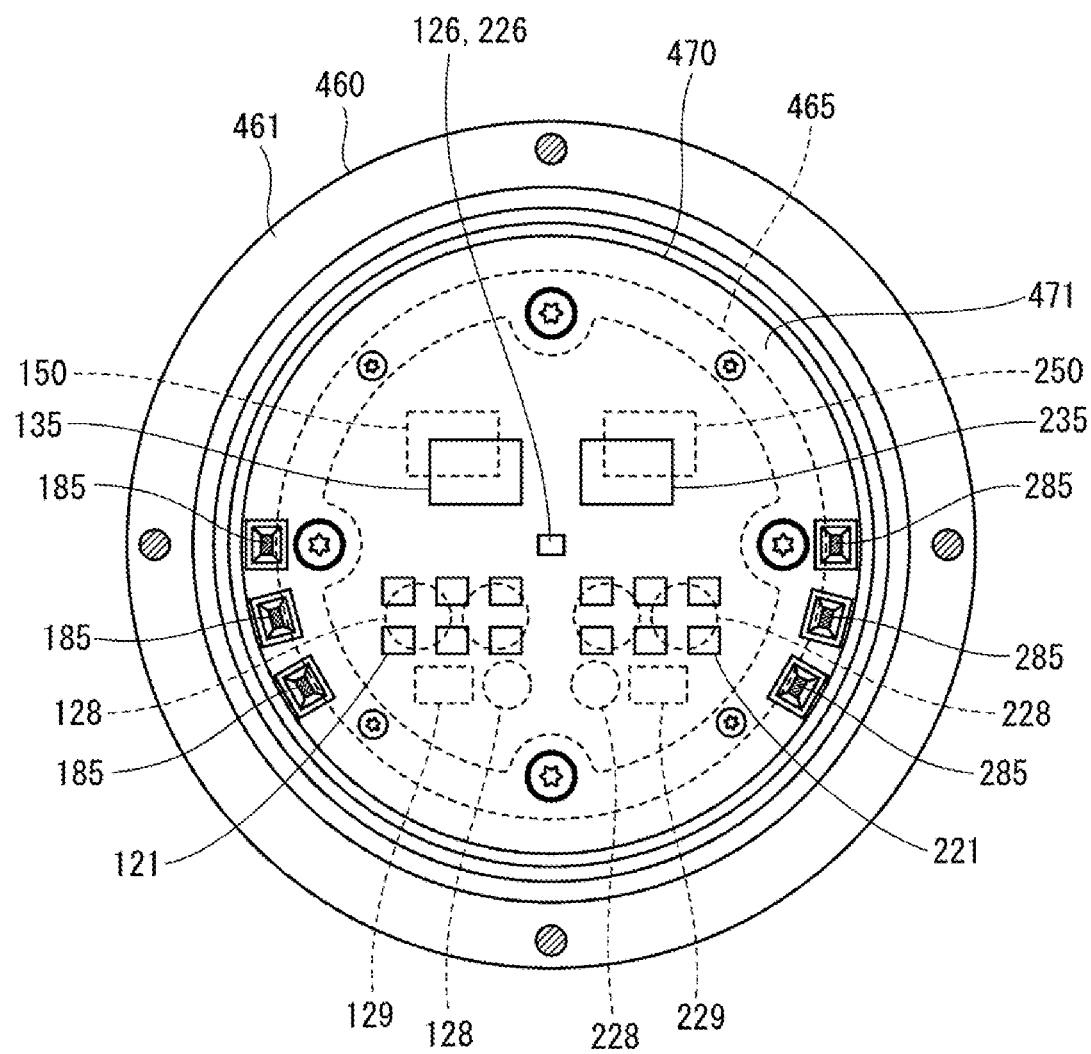
FIG. 3 is a cross-sectional view taken along a line Ill-Ill in FIG. 2.

Of the two principal surfaces of the circuit board 470, one surface facing the motor 80 is referred to as a motor-side surface 471 and the other surface opposite from (i.e., facing away from) the motor 80 is referred to as a cover-side surface 472. As shown in FIG. 3, switching elements 121 configuring the inverter unit 120, switching elements 221 configuring the inverter unit 220, rotation angle sensors 126, 226, custom ICs 135, 235 and the like are mounted on the motor-side surface 471. The angle sensors 126 and 226 are mounted at positions facing the magnet 875 to be able to detect a change in the magnetic field caused by the rotation of the magnet 875.

On the cover-side surface 472, capacitors 128, 228, inductors 129, 229, and microcomputers forming the control circuit units 150, 250 are mounted. In FIG. 3, reference numerals 150 and 250 are assigned to the microcomputers provided as the control circuit units 150 and 250, respectively. The capacitors 128 and 228 smoothen electric power input from the batteries 101 and 201. The capacitors 128 and 228 assist supply of electric power to the motor 80 by storing electric charge therein. The capacitors 128, 228 and the inductors 129, 229 configure filter circuits, respectively, to reduce noises transmitted from other devices which share the battery, and also to reduce noises transmitted to the other devices, which share the battery, from the driving device 40. Although not shown in FIG. 3, power source relays 122, 222, motor relays 125, 225, current sensors 127, 227 and the like are also mounted on the motor-side surface 471 or on the cover-side surface 472.

Figure 4:
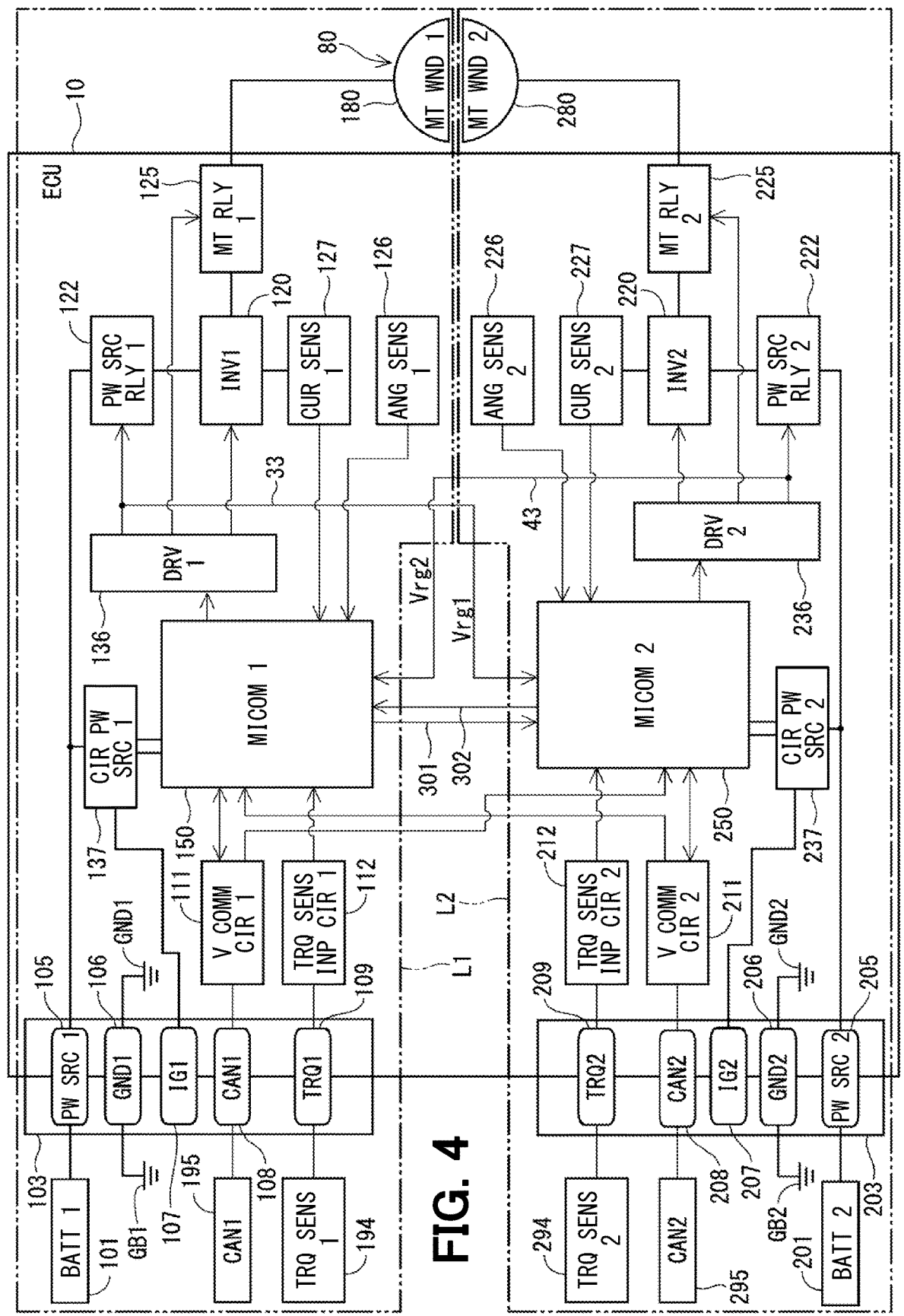
FIG. 4 is a block diagram of an electronic control unit (ECU) according to the first embodiment.

As shown in FIG. 4, the ECU 10 includes the inverter units 120, 220 and the control circuit units 150, 250. In the drawings and the like, the "control circuit unit" may simply be referred to as "microcomputer." The ECU 10 is provided with the connector units 103 and 203. The first connector unit 103 is provided with a first power source terminal 105, a first ground terminal 106, a first IG terminal 107, a first communication terminal 108, and a first torque terminal 109.

The first power source terminal 105 is connected to a first battery 101 via a fuse (not shown). The electric power from a positive electrode of the first battery 101 via the first power source terminal 105 is supplied to the first motor winding 180 via the power source relay 122, the inverter unit 120, and the motor relay 125. The first ground terminal 106 is connected to a first ground GND1 that is a first system ground inside the ECU 10 and to a first external ground GB1 that is a first system ground outside the ECU 10. In a vehicle system, the metal body is a common GND plane. The first external ground GB1 indicates one of the connection points on the GND plane, and a negative electrode of a second battery 201 is also connected to the connection point on the same common GND plane.

The first IG terminal 107 is connected to the positive electrode of the first battery 101 via a first switch that is on/off-controlled in conjunction with a vehicle start switch such as an ignition (IG) switch. The electric power from the first battery 101 via the first IG terminal 107 is supplied to the first custom IC 135. The first custom IC 135 includes a first driver circuit 136, a first circuit power source 137, a microcomputer monitor (not shown), a current monitor amplifier (not shown), and the like.

The first communication terminal 108 is connected to a first vehicle communication circuit 111 and to a first vehicle communication network 195. The first vehicle communication network 195 and the first control circuit unit 150 are connected via the first vehicle communication circuit 111 so that transmission and reception of data is performed. Further, the first vehicle communication network 195 and the second control circuit unit 250 are connected so that only reception of data by the second control circuit unit 250 is performable. Thus, even if the second control circuit unit 250 fails to operate, the first vehicle communication network 195 including the first control circuit unit 150 is not affected.

The first torque terminal 109 is connected to the first sensor unit 194 of the torque sensor 94. The detection value of the first sensor unit 194 is input to the first control circuit unit 150 via the first torque terminal 109 and a first torque sensor input circuit 112. Here, the first sensor unit 194 and the first control circuit unit 150 are configured such that a failure involving the torque sensor input circuit is detectable.

The second connector unit 203 is provided with a second power source terminal 205, a second ground terminal 206, a second IG terminal 207, a second communication terminal 208, and a second torque terminal 209. The second power source terminal 205 is connected to a positive electrode of the second battery 201 via a fuse (not shown). The electric power from the positive electrode of the second battery 201 via the second power source terminal 205 is supplied to the second motor winding 280 via the power source relay 222, the inverter unit 220, and the motor relay 225. The second ground terminal 206 is connected to a second ground GND2 that is a second system ground inside the ECU 10 and a second external ground GB2 that is a second system ground outside the ECU 10. In the vehicle system, the metal body is a common GND plane. The second external ground GB2 indicates one of the connection points on the GND plane, and a negative electrode of the second battery 201 is also connected to the connection point on the same common GND plane. Here, at least different systems are configured not to be connected to the same connection point on the GND plane.

The second IG terminal 207 is connected to the positive electrode of the second battery 201 via a second switch that is on/off-controlled in conjunction with the start switch of the vehicle. The electric power from the second battery 201 via the second IG terminal 207 is supplied to the second custom IC 235. The second custom IC 235 includes a second driver circuit 236, a second circuit power source 237, a microcomputer monitor (not shown), a current monitor amplifier (not shown), and the like.

The second communication terminal 208 is connected to a second vehicle communication circuit 211 and a second vehicle communication network 295. The second vehicle communication network 295 and the second control circuit unit 250 are connected via the second vehicle communication circuit 211 so that transmission and reception of data is performable. Further, the second vehicle communication network 295 and the first control circuit unit 150 are connected so that only reception of data by the first control circuit unit 150 is performable. Thus, even if the first control circuit unit 250 fails to operate, the second vehicle communication network 295 including the second control circuit unit 250 is not affected.

The second torque terminal 209 is connected to the second sensor unit 294 of the torque sensor 94. The detection value of the second sensor unit 294 is input to the second control circuit unit 250 via the second torque terminal 209 and the second torque sensor input circuit 212. Here, the second sensor unit 294 and the second control circuit unit 150 are configured such that a failure involving the torque sensor input circuit is detectable.

In FIG. 4, the communication terminals 108 and 208 are connected to separate vehicle communication networks 195 and 295, respectively, but may also be connected to the same vehicle communication network. Regarding the vehicle communication networks 195 and 295 in FIG. 4, CAN (controller area network) is exemplified. However, any other standard such as CAN-FD (CAN with flexible data rate), FlexRay or the like may also be employed.

The first inverter unit 120 is a three-phase inverter having the switching elements 121, and converts electric power of the first motor winding 180. The second inverter unit 220 is a three-phase inverter having the switching elements 221, and converts electric power of the second motor winding 280.

The first power source relay 122 is provided at a position between the first power source terminal 105 and the first inverter unit 120. The first motor relay 125 is provided in each phase at a position between the first inverter unit 120 and the first motor winding 180. The second power source relay 222 is provided at a position between the second power source terminal 205 and the second inverter unit 220. The second motor relay 225 is provided in each phase at a position between the second inverter unit 220 and the second motor winding 180.

Figure 5:
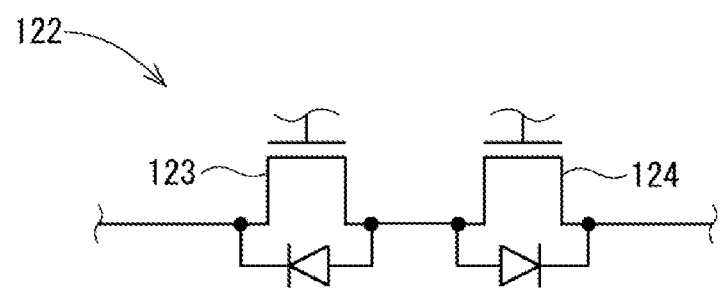
FIG. 5 is a circuit diagram illustrating a power source relay according to the first embodiment.

In the present embodiment, the switching elements 121 and 221, the power source relays 122 and 222, and the motor relays 125 and 225 are all MOSFETs (i.e., an abbreviation of Metal Oxide Semiconductor Field Effect Transistor), but other elements such as IGBTs may alternatively be used. As shown in FIG. 5, in case that the first power source relay 122 is configured by an element such as a MOSFET having a parasitic diode, two elements 123 and 124 are connected preferably in series so that the directions of the parasitic diodes are reversed. The second power source relay 222 is configured in the same way, although not shown. Thereby, even when the batteries 101 and 201 are erroneously connected in the reverse direction, it is possible to prevent a reverse current from flowing. The power source relays 122 and 222 may also be mechanical relays.

As shown in FIG. 4, on/off operations of the first switching element 121, the first power source relay 122 and the first motor relay 125 are controlled by the first control circuit unit 150. On/off operations of the second switching element 221, the second power source relay 222 and the second motor relay 225 are controlled by the second control circuit unit 250.

The first angle sensor 126 detects a rotation angle of the motor 80, and outputs the detection value to the first control circuit unit 150. The second angle sensor 226 detects the rotation angle of the motor 80, and outputs the detection value to the second control circuit unit 250. The first angle sensor 126 and the first control circuit unit 150, and the second angle sensor 226 and the second control circuit unit 250 are respectively configured such that a failure involving the angle sensor input circuit is detectable.

The first current sensor 127 detects an electric current that is supplied to each phase of the first motor winding 180. The detection value of the first current sensor 127 is amplified by an amplifier circuit in the custom IC 135, and is output to the first control circuit unit 150. The second current sensor 227 detects an electric current that is supplied to each phase of the second motor winding 280. The detection value of the second current sensor 227 is amplified by an amplifier circuit in the custom IC 235, and is output to the second control circuit unit 250.

The first driver circuit 136 outputs driving signals to each of the first switching element 121, the first power source relay 122 and the first motor relay 125 based on control signals from the first control circuit unit 150. The second driver circuit 236 outputs driving signals to of the second switching element 221, the second power source relay 222 and the second motor relay 225 based on control signals from the second control circuit unit 250.

Each of the control circuit units 150 and 250 is mainly composed of a microcomputer and the like, and internally includes, although not shown in the drawing, a CPU, a ROM, a RAM, an I/O, a bus line for connecting those components, and the like. Processes performed by each of the control circuit units 150 and 250 may be software processing or may be hardware processing, among which the software processing may be implemented by causing the CPU to execute a program stored in advance in a memory device such as a ROM, that is, in a computer-readable, non-transitory, tangible storage medium, and the hardware processing may be implemented by a special purpose electronic circuit. Here, the first control circuit unit 150 and the second control circuit unit 250 are respectively configured to be capable of detection their own failures by using, for example, a locked-step dual microcomputer or the like.

The first control circuit unit 150 controls energization of the first motor winding 180 by controlling the on/off operation of the first switching element 121. The second control circuit unit 250 controls energization of the second motor winding 280 by controlling the on/off operation of the second switching element 221. In such manner, the driving of the motor 80 is controlled by the control circuit units 150 and 250.

The first control circuit unit 150 controls the on/off operation of the first power source relay 122 and the first motor relay 125. Further, the first control circuit unit 150 and the first custom IC 135 monitor abnormality of a subject system, i.e., the first system L1, and, when an abnormality is caused during which the subject system (i.e., the first system L1) should be stopped, turn off one or more of the first inverter unit 120, the first power source relay 122 and the first motor relay 125.

The second control circuit unit 250 controls the on/off operation of the second power source relay 222 and the second motor relay 225. The second control circuit unit 250 and the second custom IC 235 monitor abnormality of the subject system, i.e., the second system L2, and, when an abnormality is caused during which the subject system (i.e., the second system L2) should be stopped, turn off one or more of the second inverter unit 220, the second power source relay 222 and the second motor relay 225.

The first control circuit unit 150 monitors an operation state of the second system L2. As a method of such monitoring, the first control circuit unit 150 monitors the state of at least one of a circuit (e.g., the second inverter unit 220, the second power source relay 222, and the second motor relay 225) or a signal line 302 in the second system L2, which should be stopped when abnormality of the second system L2 is detected, for determining whether the monitored component is in a state of an emergency stop. In the present embodiment, the operation state of the second power source relay 222 is monitored based on a second relay gate signal Vrg2 output from the second driver circuit 236 to the second power source relay 222.

The second control circuit unit 250 monitors an operation state of the first system L1. As the method of monitoring, the second control circuit unit 250 monitors the state of at least one of a circuit (e.g., the first inverter unit 120, the first power source relay 122, and the first motor relay 125) or a signal line 301 in the first system L1, which should be stopped when abnormality of the first system L1 is detected, for determining whether the monitored component is in a state of an emergency stop. In the present embodiment, the state of the first power source relay 122 is monitored based on a first relay gate signal Vrg1 output from the first driver circuit 136 to the first power source relay 122. Instead of monitoring the relay gate signal, an intermediate voltage between the two elements 123 and 124 constituting the power source relay 122, a relay drive signal output from the control circuit unit 150, or an after-relay voltage between the power source relay 122 and the inverter unit 120 may be monitored, for the monitoring of the other system. Monitoring of the second system L2 by the first control circuit unit 150 may also be configured in the same manner.

The first control circuit unit 150 and the second control circuit unit 250 are connected by the signal lines 301 and 302 to be capable of transmitting and receiving information by inter-microcomputer communications. The signal line 301 has the first control circuit unit 150 on an output side, and has the second control circuit unit 250 on an input side. The signal line 302 has the second control circuit unit 250 on an output side, and has the first control circuit unit 150 on an input side. That is, the input and output directions of the signal lines 301 and 302 are opposite to each other.

Figure 6:
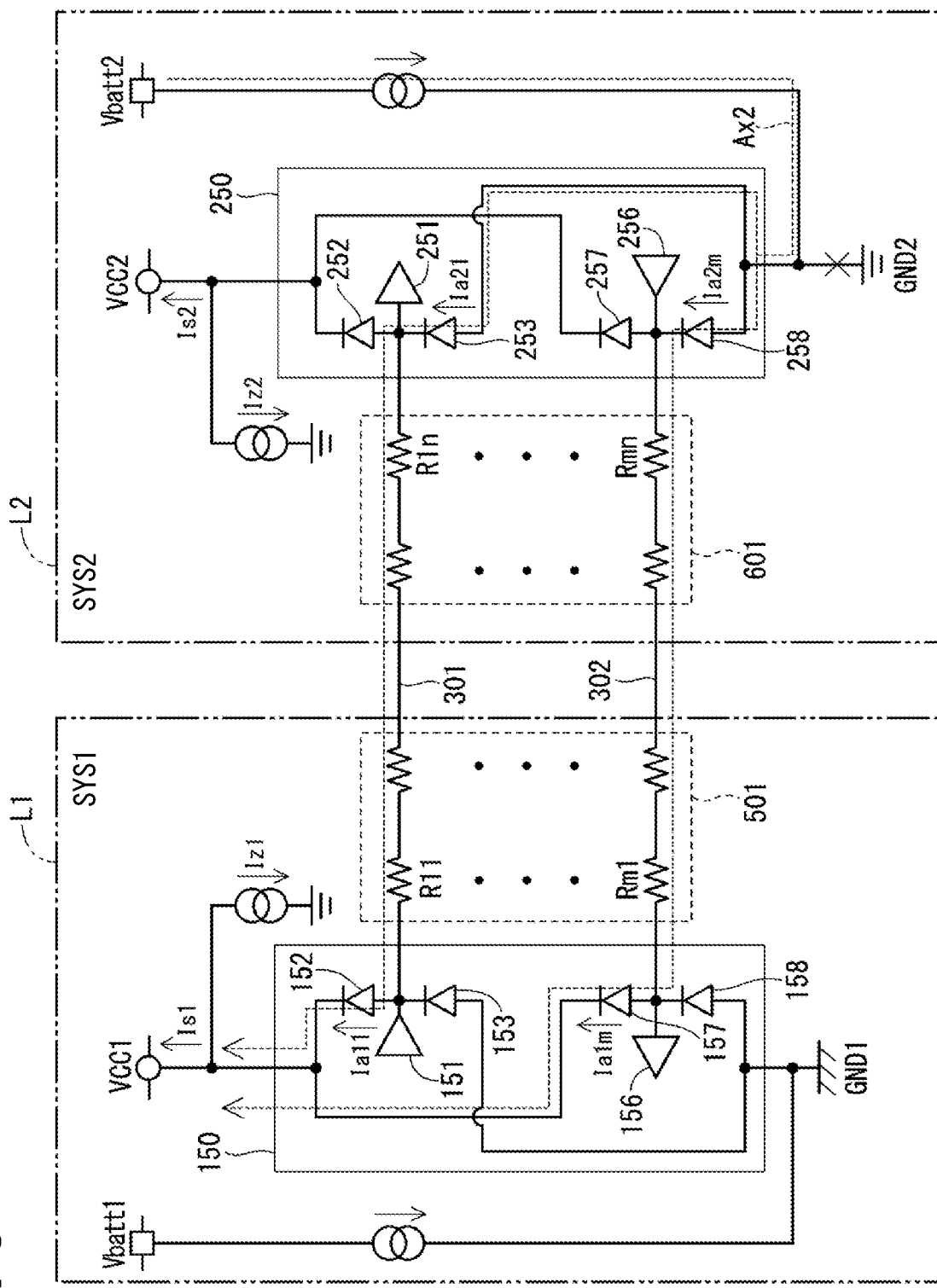
FIG. 6 is a circuit diagram illustrating a sneak-in suppression circuit according to the first embodiment.

As illustrated in FIG. 6, the first control circuit unit 150 includes, regarding the signal line 301, an output circuit 151 connected to the signal line 301, a diode 152 provided at a position between the signal line 301 and the first circuit power source 137, and a diode 153 provided at a position between the signal line 301 and the first ground GND1. The first control circuit unit 150 further includes, regarding the signal line 302, an input circuit 156 connected to the signal line 302, a diode 157 provided at a position between the first circuit power source 137 and the signal line 302, and a diode 158 provided at a position between the signal line 302 and the first ground GND1.

The second control circuit unit 250 includes, regarding the signal line 301, an input circuit 251 connected to the signal line 301, a diode 252 provided at a position between the signal line 301 and the second circuit power source 237, and a diode 253 provided at a position between the signal line 301 and the second ground GND2. The second control circuit unit 250 further includes, regarding the signal line 302, an output circuit 256 connected to the signal line 302, a diode 257 provided at a position between the signal line 302 and the second circuit power source 237, and a diode 258 provided at a position between the signal line 302 and the second ground GND2.

The diodes 152, 153, 157, 158, 252, 253, 257, and 258 are all provided to allow (i.e., flow) an electric current from a low potential side to a high potential side. In FIG. 6 and the like, the batteries 101 and 201 are described as Vbatt 1 and Vbatt2, the circuit power sources 137 and 237 are current sources Vcc1 and Vcc2. Hereinafter, the signal line 301 having the first system L1 on an output side and the second system L2 on an input side will be mainly described. Note that the configuration of the signal line 302 is reversed from that of the signal line 301 in terms of an input and an output.

In the present embodiment, the ground GND1 and GND2 are separated between the first system L1 and the second system L2. Here, when a ground abnormality such as a floating ground potential or ground disconnection occurs in one system, a sneak current via the signal line 301 is generated. In this specification, the floating ground potential and the ground disconnection are simply referred to as "ground abnormality," and are indicated by using an "X" sign as appropriate in the drawing. In addition, an electric current that flows due to the ground abnormality of the second ground GND2 is indicated by a dashed arrow Ax2, and a current that flows due to the ground abnormality of the first ground GND1 is indicated by a dashed-dotted arrow Ax1. Further, a position where a tip of the dash line or the dashed-dotted line stops at a circle indicates that an electric current flowing across the systems is interrupted at such position when the ground abnormality occurs.

Figure 14:
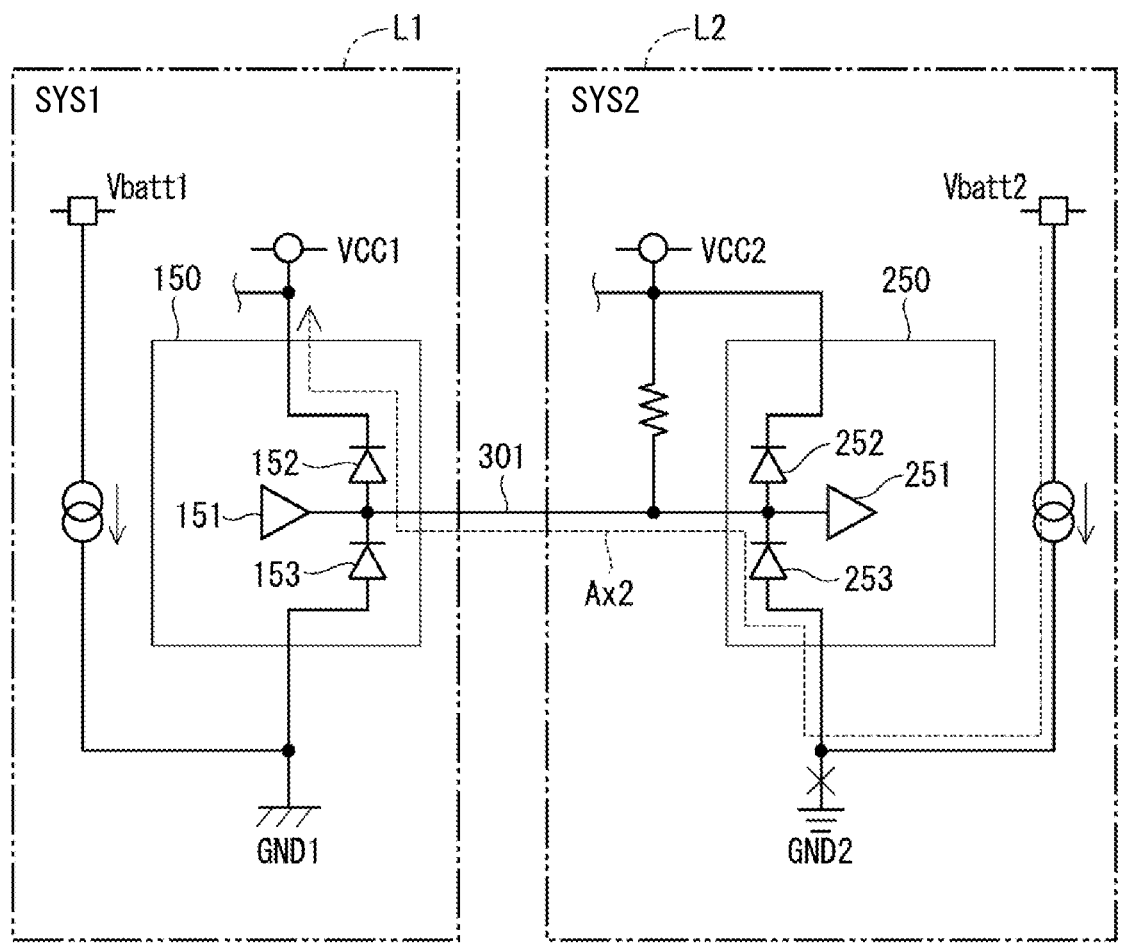
FIG. 14 is a circuit diagram illustrating a sneak current when a ground is abnormal.

For example, in the reference example shown in FIG. 14, when a ground abnormality occurs in the second system L2, as indicated by an arrow Ax2, an electric current sneaks into the first system L1, which is a normal system, via the diodes 253 and 152 of the signal line 301. As a result, when a high voltage or an overcurrent is applied to the signal line 301 or when the voltage of the first circuit power source 137 rises, there is a possibility that a malfunction or failure of the circuit may occur in the first system L1. For example, a sneak current can be prevented by providing an insulation type interface using a photo-coupler, a transformer and the like. However, these insulation type interfaces are expensive and large in size, and may be not mountable due to restrictions such as profitability and/or the mounting space of the board 470.

Therefore, in the present embodiment, as shown in FIG. 6, sneak-in suppression circuits 501 and 601 are provided on the signal lines 301 and 302 that connect the first control circuit unit 150 and the second control circuit unit 250. Hereinafter, the parts and the like constituting the sneak-in suppression circuit provided in the first system L1 are numbered as 500 order, and the parts and the like constituting the sneak-in suppression circuit provided in the second system L2 are numbered as 600 order.

In the present embodiment, the sneak current is limited by inserting n pieces of resistor (i.e., n is an integer of 2 or more) in series in the signal lines 301 and 302 as sneak-in suppression circuits 501 and 601, respectively. Such configuration is preferably used for a signal line that performs communication at a relatively low speed. Specifically, resistors R11 to R1n are inserted in series in the signal line 301. Also, resistors Rm1 to Rmn are inserted in series in the signal line 302. Hereinafter, as appropriate, the resistors provided in the signal line 301 are collectively referred to as a resistor R1, and the resistors provided in the signal line 302 are collectively referred to as a resistor Rm.

When the ground disconnection occurs in the second system L2, the ground potential may rise up (i.e., float) to the vicinity of the second battery voltage Vbatt2, which is a voltage of the second battery 201, at most. Therefore, resistors are inserted in series in the signal lines 301 and 302 so that the electric current flowing into the first system L1 when the ground potential of the second ground GND2 rises to the second battery voltage Vbatt2 has a value that does not cause a malfunction or a failure of the first system L1

Note that, in a situation, for example, that a circuit is having a short failure in which a resistance value lowers in the resistors R1 and Rm, the function of such circuit may look normally (i.e., is normally operable), thereby such a failure may go undetected in the working system. If a ground disconnection occurs in such state, both systems may fail, and assistance may be not continuable. However, a failure detection circuit or the like is added to prevent such a situation, and as such, the circuit configuration may become complicated.

Therefore, in the present embodiment, paying attention to the fact that the failure rate of resistors is very low, by inserting two or more resistors in the signal lines 301 and 302 as the sneak-in suppression circuits 501 and 601, a configuration in which the probability of failure generation is greatly reduced is realized For example, if the failure rate of one resistor is 1 FIT (Failure In Time=1×10$^{-9}$/hr), the probability A that both of two resistors will fail in a period of 20 years when the two resistors are connected in series is as shown in an equation (1), which is as close to 0 as possible. Thereby, high safety, high quality, small size and a low cost configuration can be realized by using a simple device. Note that the resistor failure rate is actually less than 1 FIT.

$$\lambda = (1 \times 10^{-9}) \times (1 \times 10^{-9}) \times 20 \times 365 \times 24 \qquad (1)$$
$$= 1.75 \times 10^{-4} \ [FIT]$$

A total resistance Rs of the resistors R1 provided in the signal line 301 is described. Assuming a worst case scenario where a battery voltage of the other system is applied to the ground due to the ground disconnection, the total resistance Rs is set to a value satisfying equations (2) and (3).

$$Rs \geq m \times (VG - Vd - Vc)/\{(m-1) \times Ia\} \qquad (2)$$

$$Is + Iz = \Sigma Ix^* \qquad (3)$$

where $Ix^* = (VG - Vd^* - Vc)/Rs^*$, =1 to n

Note that one of Rs* is set as a value when one of the resistors constituting Rs* is short-circuited.

The symbols in the equation are as follows. Note that, in FIG. 6, suffixes indicating system numbers and signal line numbers are added as appropriate.

VG: Maximum value of ground floating (≈Maximum value of A power source voltage of a ground disconnected system)

Ia: Allowable electric current value of the sneak current via a path along the signal line=Min [Ia1, Ia2]

Vd: Voltage drop in the sneak path except Rs (i.e., wiring resistance, parasitic Di, Zdi, etc.)

Vc: Power source voltage of a power source system from which the sneak current flows Is: Power source current drawn from a power source of a system from which a sneak current flows Is=0 is set for a unipolar power source Iz: Load current of the power source system causing the sneak current m: Number of inter-system signals that sneak into the same power source system n: Number of series resistors From the equations (2) and (3), the greater the total resistance Rs of the resistors inserted into the signal lines 301 and 302, the higher the margin becomes. However, on the other hand, when the total resistance Rs increases, a tolerance to a leak current in the signal lines 301 and 302 may fall, and/or the communication speed may fall due to a signal delay caused by the parasitic capacitance of the signal lines 301 and 302. Therefore, in consideration of these points, an upper limit of the total resistance Rs is determined by designing the interface so that a desired signal frequency and threshold value are satisfied.

As described above, the ECU 10 includes the plurality of control circuit units 150 and 250, the signal lines 301 and 302, and the sneak-in suppression circuits 501 and 601. The control circuit units 150 and 250 are respectively connected to separate grounds. The signal line connects the first control circuit unit 150 and the second control circuit unit 250. Here, a combination of components and grounds provided corresponding to each of the control circuit units 150 and 250 is designated as a system. The sneak-in suppression circuits 501 and 601 respectively suppress the sneak-in of electric power from the ground of one system to the other system via a connection by the signal lines 301 and 302. Even when a ground abnormality such as ground floating or ground disconnection occurs in one of plural systems, electric power is prevented from sneaking into the normal system via the signal lines 301 and 302, thereby preventing a sneak-infailure that causes a failure of the normal system, and a control using a normal system is continuable.

The sneak-in suppression circuits 501 and 601 of the present embodiment have n pieces of resistors R11 to R1$n$ and Rm1 to Rmn connected in series (i.e., n is an integer of 2 or more). By appropriately setting the resistance value, it is possible to appropriately suppress the sneak current while allowing signal transmission with a relatively simple configuration. Further, in such configuration, since the wiring capacitance exists in a manner of distributed constant, which is proportional to the wiring length, the frequency characteristics of the signal are improvable by devising a configuration in which the resistance value of the resistor near the output side is set to a relatively small value and the resistance value of the resistor near the input side is set to a relatively large value.

Second Embodiment, Third Embodiment

Figure 7:
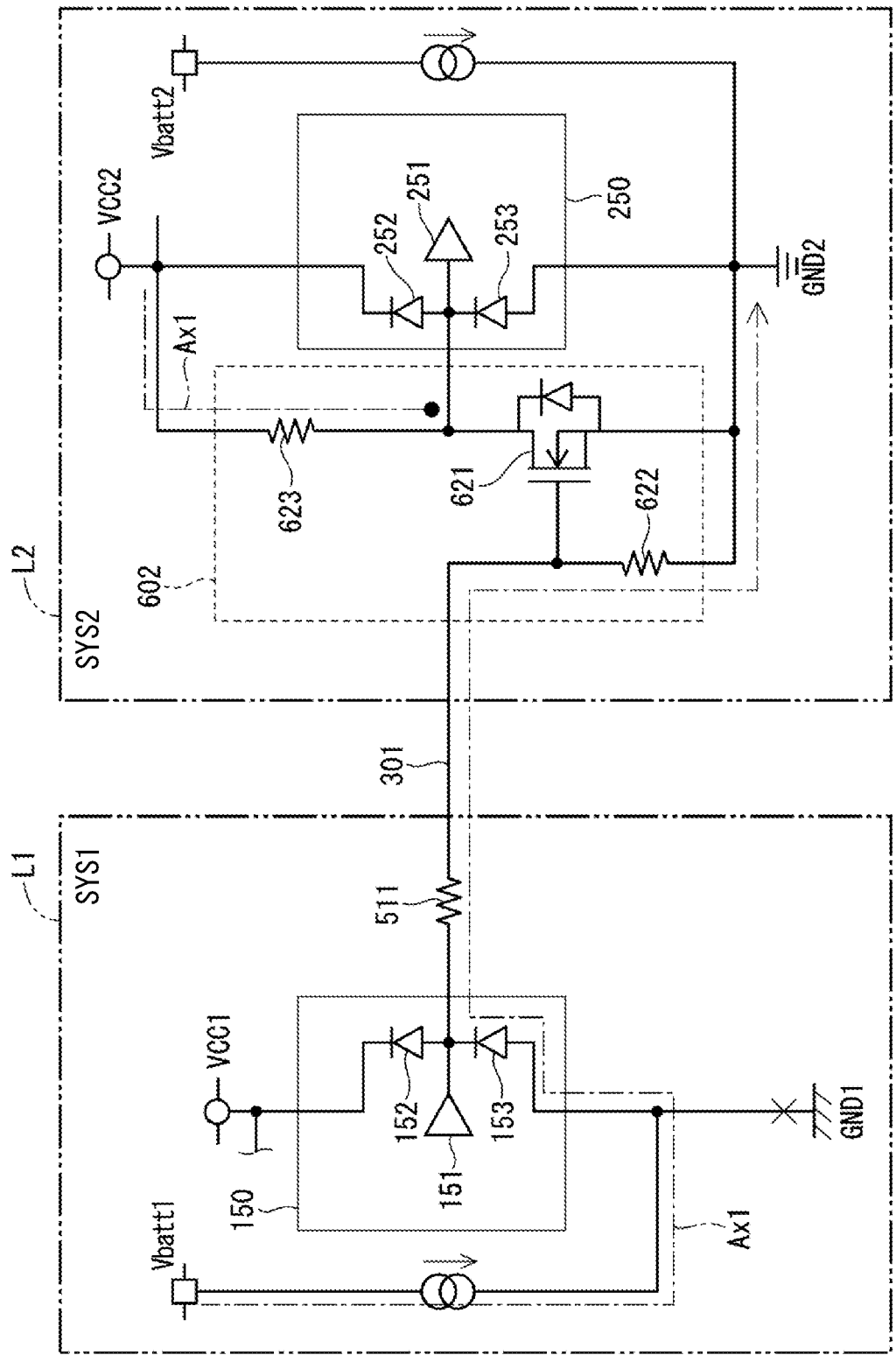
FIG. 7 is a circuit diagram illustrating the sneak-in suppression circuit according to a second embodiment.
Figure 8:
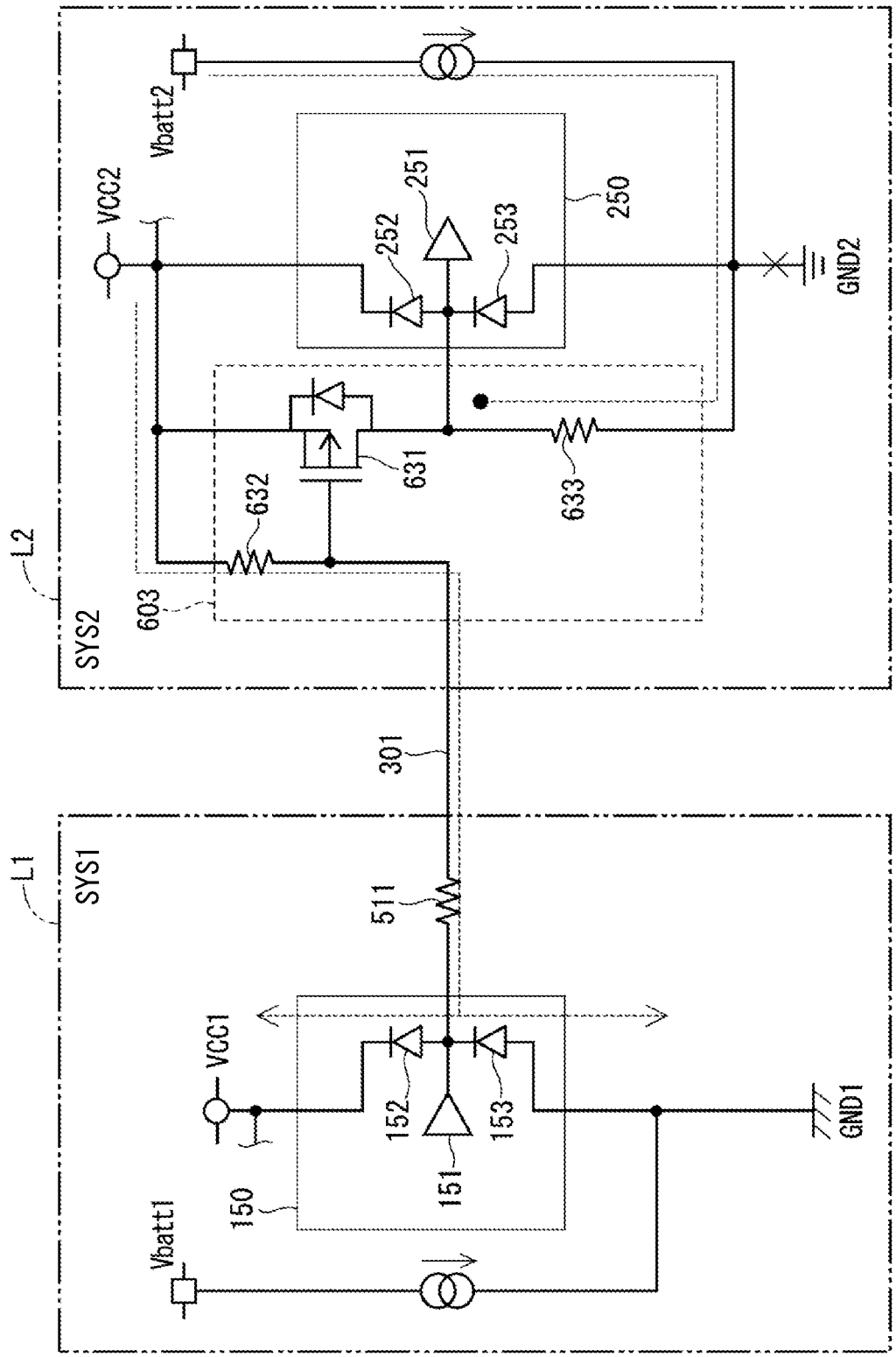
FIG. 8 is a circuit diagram illustrating the sneak-in suppression circuit according to a third embodiment.

The second embodiment is shown in FIG. 7, and the third embodiment is shown in FIG. 8. In the following embodiments, a description will be focused on a sneak-in suppression circuit provided in the signal line 301.

As shown in FIG. 7, in the second embodiment, a sneak-in suppression circuit 602 provided in the second system L2 includes an n-channel field effect transistor (FET) 621 and resistors 622 and 623. The output terminal of the first control circuit unit 150 is connected to a gate of the FET 621 via a resistor 511. A resistor 622 is provided at a position between the gate of the FET 621 and the second ground GND2. A source of the FET 621 is connected to a position between the resistor 622 and the second ground GND2. A drain of the FET 621 is connected to the input terminal of the second control circuit unit 250. The drain of the FET 621 is connected to the second circuit power source 237 via the resistor 623.

The FET 621 is provided with a protection diode that allows energization from the low potential side to the high potential side. Similarly, other FETs to be described later are provided with protection diodes.

As shown in FIG. 8, in the third embodiment, the sneak-in suppression circuit 603 provided in the second system L2 includes a p-channel FET 631 and resistors 632 and 633. The output terminal of the first control circuit unit 150 is connected to a gate of the FET 631 via the resistor 511. The resistor 632 is provided at a position between the gate of the FET 631 and the second circuit power source 237.

A source of the FET 631 is connected to a position between the resistor 632 and the second circuit power source 237. A drain of the FET 631 is connected to the input terminal of the second control circuit unit 250. The drain of the FET 631 is also connected to the second ground GND2 via the resistor 633.

The FETs 621 and 631 have a gate breakdown voltage higher than the battery voltages Vbatt1 and Vbatt2 of both systems. The sneak-in suppression circuit 602 of the second embodiment and the sneak-in suppression circuit 603 of the third embodiment are preferably used for relatively low-speed signal lines, as in the first embodiment. Further, if the resistance values of the resistors 622 and 632 are large, the sneak current can be suppressed, which enables omission of the resistor 511.

Note that, in the sneak-in suppression circuits 602 and 603, a scenario of a simultaneous failure of the two systems may be considered as follows, in which, as a primary failure, a gate short circuit of the FETs 621 and 631 or a short circuit failure of the resistors 622 and 632 is caused, and then (i.e., as a secondary failure) a disconnection or ground floating of the second ground GND2 is caused. Therefore, it may be desirable that, when a short circuit of the gate of the FET 621 or the short circuit failure of the resistors 622 and 632 is caused, such abnormality is detected promptly, as fast as possible. For such purposes, a confirmation sequence of outputting and confirming an ON/OFF signal when starting up a power source may be added, for example. "Power source" corresponds to the circuit power sources 137 and 237. Alternatively, abnormality can always be detected by using a pulsed signal, i.e., by introducing a communication method such as serial communication, pulse width modulation (PWM) communication, or pulse frequency modulation (PFM) communication. Here, by adding check data such as ECC (Error Correction Code), parity, or CRC (Cyclic Redundancy Check) to the data sent through the pulsed signal line, the signal abnormality detection sensitivity can be further increased. Then, upon detecting abnormality, it may be designed so that a vehicle system transitions to a safe state such as stopping or the like, for example. Further, even if a GND abnormality occurs thereafter, safety can be ensured by designing the first system L1 prevented from suffering from a subordinate failure, for example, by adding the resistor 511. Such a configuration related to abnormality detection is also applicable to the first embodiment and to the embodiments described later.

The sneak-in suppression circuits 602 and 603 are provided in a system to which a signal is input, and include at least one FET 621 or 631 that is a field effect transistor. In the second embodiment, the FET 621 is an n-channel type, and the sneak-in suppression circuit 602 includes the resistor 622 as a first resistor and the resistor 623 as a second resistor in addition to the FET 621. The resistor 622 is provided at a position between the gate of the FET 621 and the ground of the subject system (i.e., the system L2). The resistor 623 is provided at a position between the source of the FET 621 and the circuit power source 237 of the subject system.

In the third embodiment, the FET 631 is a p-channel type, and the sneak-in suppression circuit 603 includes the resistor 632 as a first resistor and the resistor 633 as a second resistor in addition to the FET 631. The resistor 632 is provided at a position between the gate of the FET 631 and the circuit power source 237 of the subject system (i.e., the system L2). The resistor 633 is provided at a position between the drain of the FET 631 and the ground of the subject system. Even in such a configuration, the sneak current at the time of ground abnormality is appropriately suppressible.

At least one of the signal lines 301 and 302 transmits and receives binary values of ON or OFF. The control circuit units 150 and 250 output ON and OFF signals when the circuit power sources 137 and 237 that supply electric power to the control circuit units 150 and 250 are started up, and are capable of determining whether or not the sneak-in suppression circuits 602 and 603 are abnormal. Further, at least one of the signal lines 301 and 302 transmits and receives a pulsed signal. Preferably, the pulsed signal includes transmission data and check data for abnormality detection. The check data for abnormality detection is, for example, ECC, parity, CRC, or the like. In such manner, the abnormality of the sneak-in suppression circuits 602 and 603 is appropriately detectable.

Fourth Embodiment

Figure 9:
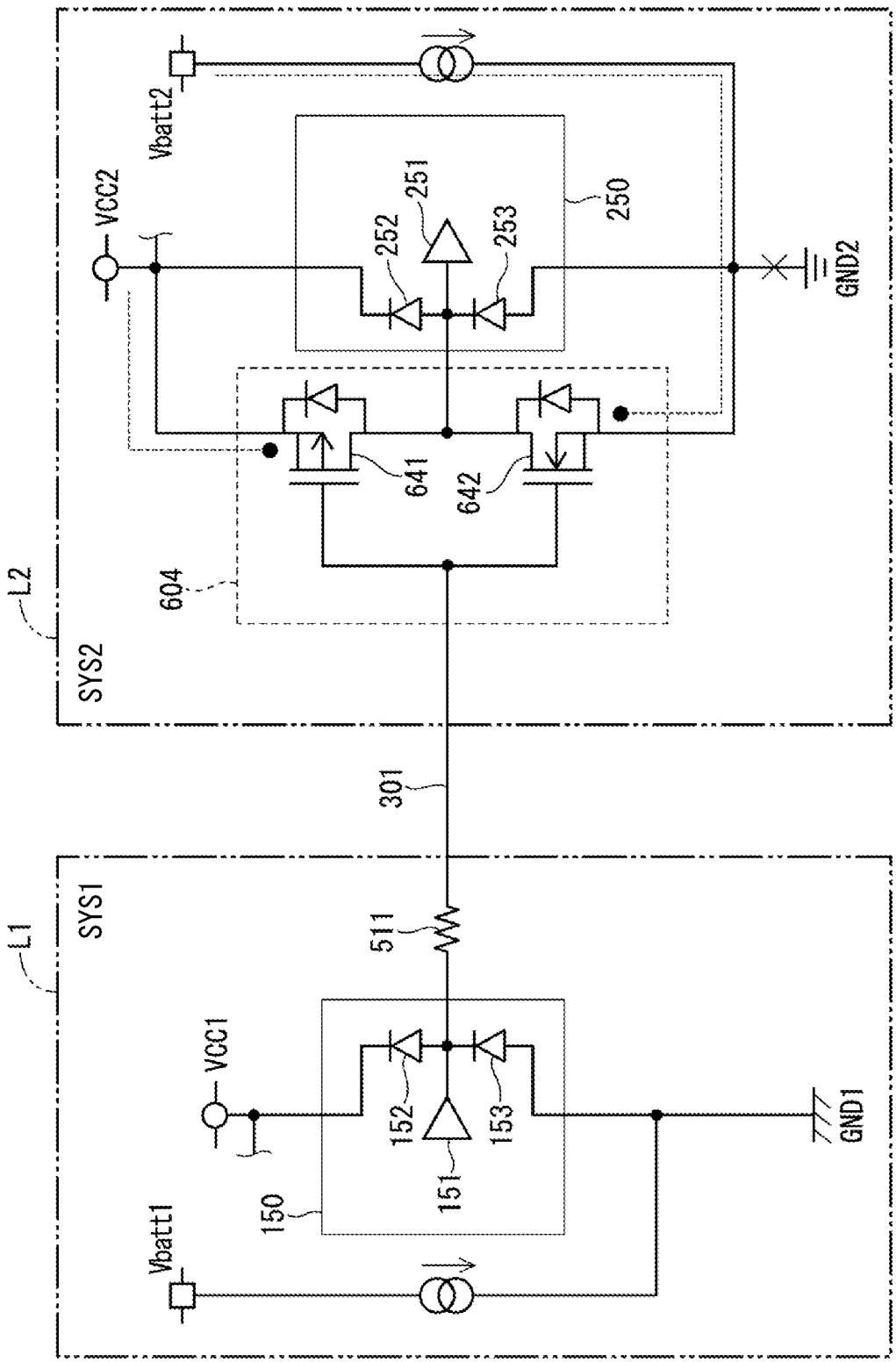
FIG. 9 is a circuit diagram illustrating the sneak-in suppression circuit according to a fourth embodiment.

The fourth embodiment is shown in FIG. 9. A sneak-in suppression circuit 604 of the present embodiment is provided in the second system L2, and includes two FETs 641 and 642. The FET 641 provided on the high potential side is a p-channel type, and the FET 641 provided on the low potential side is an n-channel type. A source of the FET 641 is connected to the second circuit power source 237 and a drain thereof is connected to a drain of the FET 642. A source of the FET 642 is connected to the second ground GND2. Gates of the FETs 641 and 642 are respectively connected to the output terminal of the first control circuit unit 150. The input terminal of the second control circuit unit 250 is connected to a position between the drain of the FET 641 and the drain of the FET 642.

As the FETs 641 and 642, those having a gate breakdown voltage equal to or higher than the battery voltages Vbatt1 and Vbatt2 of both systems are used. The sneak-in suppression circuit 604 of the present embodiment is applicable to a relatively high-speed signal line as compared with the above-described embodiments. As already shown in the second and third embodiments, it may be desirable that the abnormality is detected promptly when a gate short circuit is caused in the FETs 641 and 642. For example, a configuration may be devised as an addition of a sequence or a pulsed signal, in which outputting an ON/OFF signal when the power is turned on and confirming such signal, for enabling detection of an abnormality at all times. Then, upon detecting abnormality, it may be designed so that a vehicle system quickly transitions to a safe state such as stopping or the like, for example. Further, even if a GND abnormality occurs thereafter, safety can be ensured by designing the first system L1 prevented from suffering from a subordinate failure, for example, by adding the resistor 511.

In the present embodiment, the sneak-in suppression circuit 604 includes two FETs 641 and 642, and one FET 641 is a p-channel type and is provided on the high potential side, and the other FET 642 is an n-channel type and is provided on the low potential side. Even in such a configuration, the sneak current at the time of ground abnormality is appropriately suppressible.

Fifth Embodiment

Figure 10:
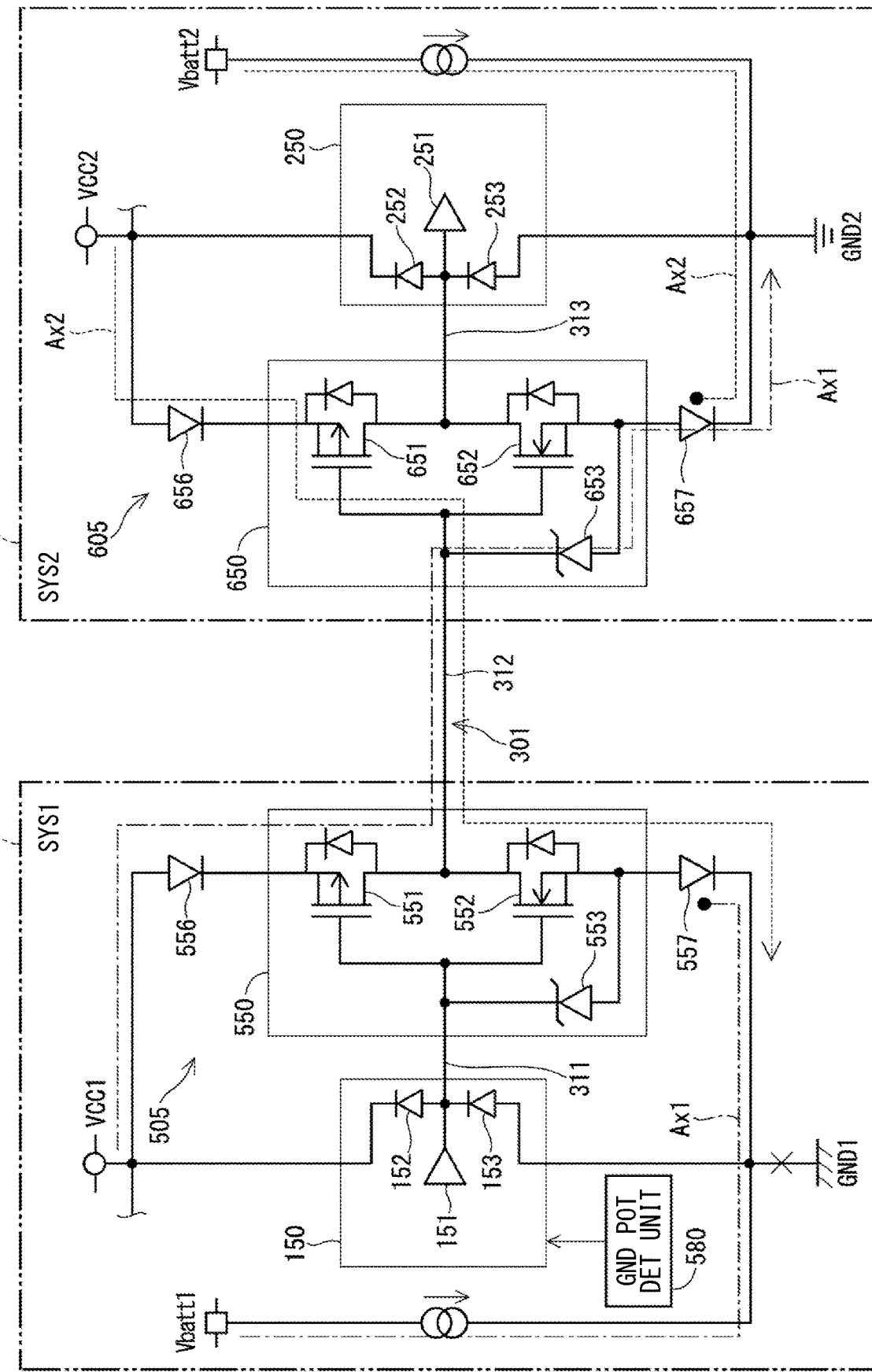
FIG. 10 is an explanatory diagram illustrating the sneak-in suppression circuit according to a fifth embodiment.

The fifth embodiment is shown in FIG. 10. Sneak-in suppression circuits 505 and 605 of the present embodiment use CMOS logic ICs and are preferably used for signal lines that require communication at a relatively high speed. In the present embodiment, the signal line 301 includes an output line 311 that connects the first control circuit unit 150 and the sneak-in suppression circuit 505, an inter-system connection line 312 that connects the sneak-in suppression circuits 505 and 605, and an output line 313 that connects the sneak-in suppression circuit 605 and the second control circuit unit 250.

The sneak-in suppression circuit 505 provided in the first system L1 includes a logic IC 550 and diodes 556 and 557. The diode 556 is provided on the high potential side of the logic IC 550, and the diode 557 is provided on the low potential side of the logic IC 550.

The logic IC 550 includes FETs 551 and 552 and a constant voltage diode 553 serving as an electrostatic protection element. Note that the electrostatic protection element may be provided as a diode configured as the ones put in between an input and a power source and in between the GND and the input. The FET 551 provided on the high potential side is a p-channel type, and the FET 552 provided on the low potential side is an n-channel type. A source of the FET 551 is connected to the first circuit power source 137 via the diode 556, and a drain thereof is connected to a drain of the FET 552. A source of the FET 552 is connected to the first ground GND1 via the diode 557. Gates of the FETs 551 and 552 are respectively connected to an output terminal of the first control circuit unit 150 via the output line 311. One end of the inter-system connection line 312 is connected between the drain of the FET 551 and the drain of the FET 552. The constant voltage diode 553 has an anode connected to the source of the FET 552 and a cathode connected to the input line 313.

The sneak-in suppression circuit 605 provided in the second system L2 includes a logic IC 650 and diodes 656 and 657. The diode 565 is provided on the high potential side of the logic IC 650, and the diode 657 is provided on the low potential side of the logic IC 650. The diodes 556 and 656 may be omitted.

The logic IC 650 includes FETs 651 and 652 and a constant voltage diode 653 serving as an electrostatic protection element. The FET 651 provided on the high potential side is a p-channel type, and the FET 652 provided on the low potential side is an n-channel type. A source of the FET 651 is connected to the second circuit power source 237 via the diode 656, and a drain thereof is connected to a drain of the FET 652. A source of the FET 652 is connected to the second ground GND2 via the diode 657. Gates of the FETs 651 and 652 are respectively connected to the other end of the inter-system connection line 312. The input terminal of the second control circuit unit 250 is connected to a position between the drain of the FET 651 and the drain of the FET 652. The constant voltage diode 653 has an anode connected to the source of the FET 652 and a cathode connected to the inter-system connection line 312. By providing the constant voltage diodes 553 and 653, the FETs 551, 552, 651, and 652 are protected from static electricity. The logic ICs 550 and 650 of the present embodiment have a lower breakdown voltage than the voltages Vbatt1 and Vbatt2 from the batteries 101 and 201 of the respective systems.

When the ground abnormality of the second ground GND2 on the input side occurs, a reverse breakdown voltage of the diode 657 is high, no sneak-in from the second ground GND2 occurs and no circuit failure is caused as shown by an energization path of the broken line. Further, regarding a sneak-in from the second circuit power source 237, if the output from the first control circuit unit 150 is Lo, the FET 552 on the low voltage side of the logic IC 550 is turned off, thereby not leading to a circuit failure even when a voltage of such current exceeds 2 folds of the normal breakdown voltage. On the other hand, when the output from the first control circuit unit 150 is Hi, the FET 552 on the low voltage side of the logic IC 550 is turned on. Therefore, a voltage derived from an addition of a potential of the second ground GND2 to the voltage of the second circuit power source 237 is applied to a position between the source and the gate of the FET 651 on the high voltage side of the logic IC 650. If this application voltage exceeds the breakdown voltage of the logic IC 650, a large current indicated by the broken arrow flows to the first ground GND1, and there is a possibility that the FET 552 on low voltage side of the logic IC 550 may fail. However, the cascading failure stops here, and does not lead to a functional failure of the first system L1.

When the ground abnormality of the first ground GND1 on the output side occurs, there is no sneak-in from the first ground GND1 as shown by the one-dot chain line energization path, and no circuit failure is caused. Regarding the sneak-in from the first circuit power source 137, if the output from the first control circuit unit 150 is Hi, the FETs 551 and 651 on the high potential side of the logic ICs 550 and 650 are respectively turned off, thereby no circuit failure will be caused even when the voltage of the sneak current exceeds a twofold of the normal breakdown voltage. On the other hand, when the output from the first control circuit unit 150 is Lo, the FETs 551 and 651 are respectively turned on, thereby a voltage derived from an addition of a potential of the first ground GND1 to the voltage of the first circuit power source 137 is applied to the signal line 301. If this application voltage exceeds the breakdown voltage of the logic IC 650, a large current indicated by a one-dot chain line may flow to the second ground GND2, leading to a failure of the diode 553 of the logic IC 650. However, cascading failure stops here, and does not lead to a functional failure of the second system L2.

In addition, in order to prevent the cascading failure at the time of GND abnormality, a ground potential detection unit 580 is provided in the present embodiment in the first system L1 that is a system on the output side, and, in case that the ground floating of exceeding the ground floating determination value that is a value set in advance as the one in a range of not causing a ground abnormality is caused, the output logic of the logic IC 550 is switched for an operation not exceeding the breakdown voltage for preventing a cascading failure.

Here, a situation in which an input breakdown voltage of the logic ICs 550 and 650 is low and a circuit breakdown may possibly be caused due to the ground abnormality is described as an example. The ground potential detection unit 580 is provided in the first system L1 that is the system on the output side and, in case that a second ground potential floats to exceed a second ground floating determination value, which is set in advance as a voltage not exceeding the input breakdown voltage of the IC 650, the output logic of the IC 650 is switched to Hi for an operation not exceeding the breakdown voltage, thereby preventing a cascading failure. Similarly, in case that a first ground potential floats to exceed a first ground floating determination value set in advance, which is set in advance as a voltage not exceeding the input breakdown voltage of the IC 650, the output logic of the logic IC 550 is switched to for an operation not exceeding the breakdown voltage, thereby prevent a cascading failure.

Figure 11:
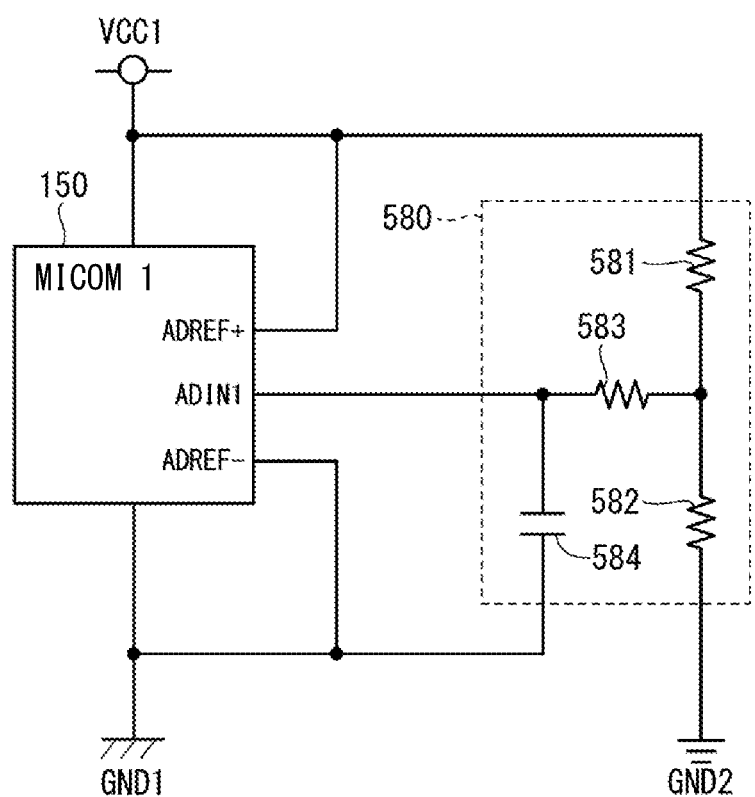
FIG. 11 is a circuit diagram illustrating a ground potential detection circuit according to the fifth embodiment.

The ground potential detection unit 580 is described with reference to FIG. 11. The ground potential detection unit 580 includes resistors 581 to 583 and a capacitor 584. The resistors 581 and 582 respectively serve as a voltage dividing resistor, and the resistor 583 and the capacitor 584 constitute a filter circuit. By providing a filter circuit, it is possible to reduce noise in the detection value.

One end of the resistor 581 is connected to the circuit power source 137 and to an ADREF+terminal, which is on the high voltage side of reference voltage, of an analog-to-digital converter (hereinafter referred to as "ADC") that is built in the control circuit unit 150, and the other end thereof is connected to the resistor 582. The resistor 582 has one end connected to the resistor 581 and the other end connected to the second ground GND2 that is a ground of the other system. One end of the resistor 583 is connected to a position between the resistors 581 and 582, and the other end is connected to an ADC input terminal (hereinafter, "ADIN1 terminal") of the control circuit unit 150. The control circuit unit 150 converts the terminal voltage of the resistor 583 into a digital value ADC1. Based on such value, the ground abnormality of the first ground GND1 and the second ground GND2 is detected. The capacitor 584 has a high potential side connected to a position between the resistor 583 and the ADIN1 terminal of the control circuit unit 150, and has a low potential side connected to a position between (i) the first ground GND1, which is a ground of the subject system and (ii) the low voltage side of the ADC reference voltage of the control circuit unit 150, i.e., the ADREF− terminal.

When the ground potential detection unit 580 configured in the above-described manner is used with an appropriate threshold value, the control circuit unit 150 can detect the ground abnormality of the subject system and the ground abnormality of the other system based on the detection value of the ADIN1 terminal. Note that the circuit configuration of the ground potential detection unit 580 is not limited to that shown in FIG. 11, but any circuit may be used as long as it is capable of detecting the ground abnormality of the subject system and the other system. Alternatively, the ground potential detection unit 580 may be omitted, for example, and a phenomenon whose behavior changes when the ground float is caused may be detected as substitute, such as communication abnormality or the like when an inter-system communication line is provided between the two systems.

In the present embodiment, a short circuit failure of the diodes 556, 557, 656, and 657 cannot be detected, resulting in an undetected failure. However, even if a ground abnormality is caused thereafter, an electric current flows to the ground side of the logic ICs 550 and 650. Therefore, as a result, the signal line 301 is eventually broken, thereby not leading to the cascading failure, thereby driving with the normal system is continuable.

Figure 15:
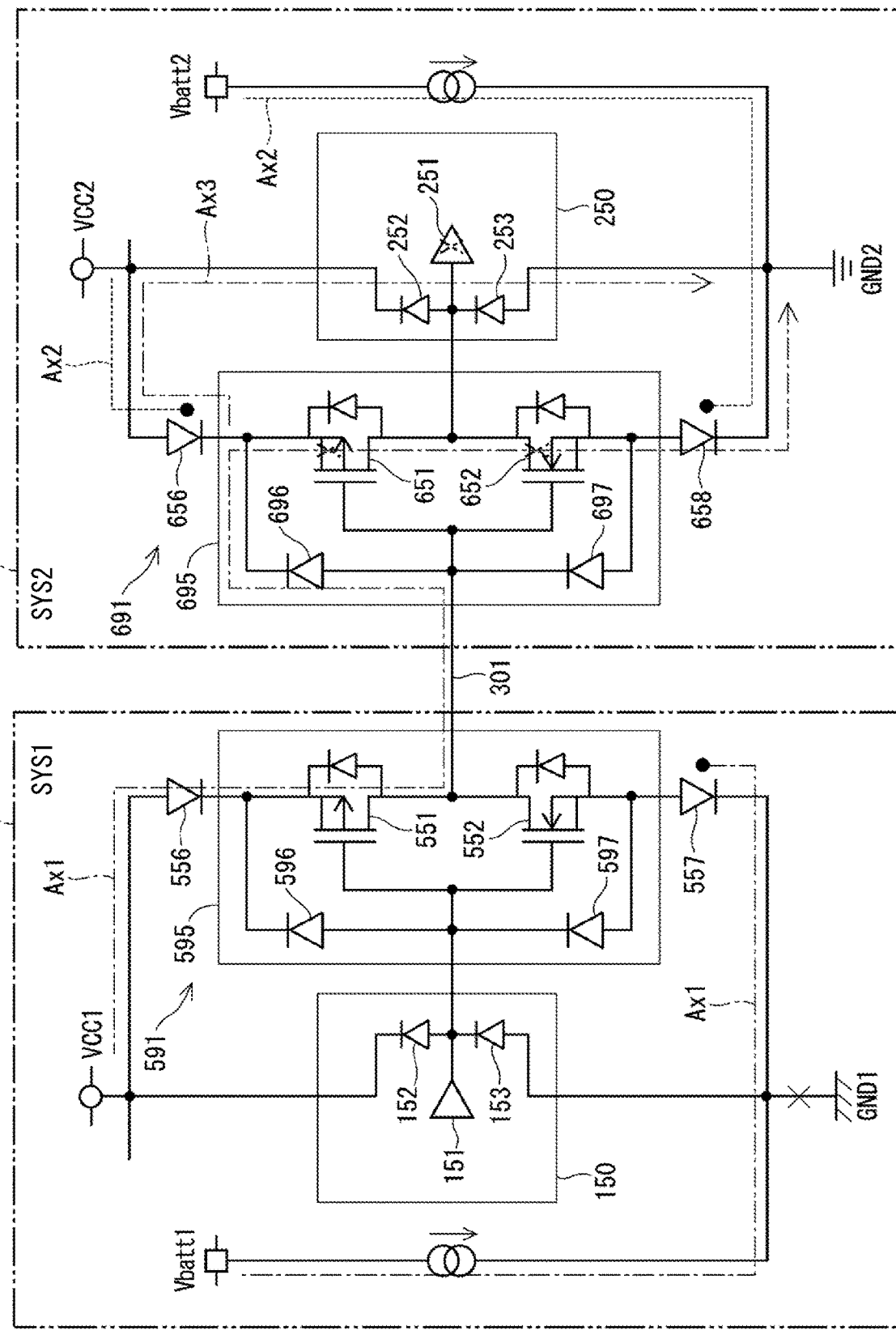
FIG. 15 is an explanatory diagram illustrating the sneak-in suppression circuit according to a reference example.

On the other hand, in a reference example of FIG. 15, a logic IC 595 of a sneak-in suppression circuit 591 is provided with two diodes 596 and 597 instead of the constant voltage diode 553. Further, a logic IC 695 of a sneak-in suppression circuit 691 is provided with two diodes 696 and 697 instead of the constant voltage diode 653. In such circuit configuration, when the ground abnormality of the first system L1 occurs in a state where the short circuit failure of the diode 656 is an undetected failure, the voltage of the second circuit power source 237 rises as shown by a one-dot chain line arrow Ax3, thereby causing element breakdown and/or malfunction of the second system L2 and possibly leading to the simultaneous failure of both systems. Note that, an X mark attached to an element in the drawing means that that element is prone to breakdown due to the ground abnormality.

The sneak-in suppression circuits 505 and 605 of the present embodiment have the logic ICs 550 and 650 respectively as a logic circuit. The logic IC 550 is a CMOS circuit, and includes two FETs 551 and 552 and the constant voltage diode 553. The constant voltage diode 553 is provided at a position between the output line 311 which is a gate signal line connected to the gates of the FETs 551 and 552 and the source of the FET 552 on the low potential side. Similarly, the logic IC 650 is a CMOS circuit, and includes two FETs 651 and 652 and a constant voltage diode 653. The constant voltage diode 653 is provided at a position between the inter-system connection line 312 which is a gate signal line connected to the gates of the FETs 651 and 652 and the source of the FET 652 on the low potential side.

Further, the sneak-in suppression circuits 505 and 605 include the diodes 557 and 658 that are respectively provided at positions between the logic ICs 550 and 650 and the ground of the respective systems (i.e., of the subject system, respectively), allowing energization only to the ground side. Even in such a configuration, the sneak current at the time of ground abnormality is appropriately suppressible. In addition, since a decrease in communication speed can be prevented by using a logic circuit as the sneak-in suppression circuits 505 and 605, high-speed communication required situation is suitably handled by such configuration.

Further, at least a signal output side system has the ground potential detection unit 580 that detects a value related to the ground potential. The control circuit unit 150 on the signal output side switches the signal output logic according to the detection value of the ground potential detection unit 580. In such manner, even if the breakdown voltages of the logic ICs 550 and 650 are low, by switching the output logic for the operation of not exceeding the breakdown voltage, the cascading failure is preventable. Further, effects similar to those of the embodiment described above are achievable.

Sixth Embodiment

Figure 12:
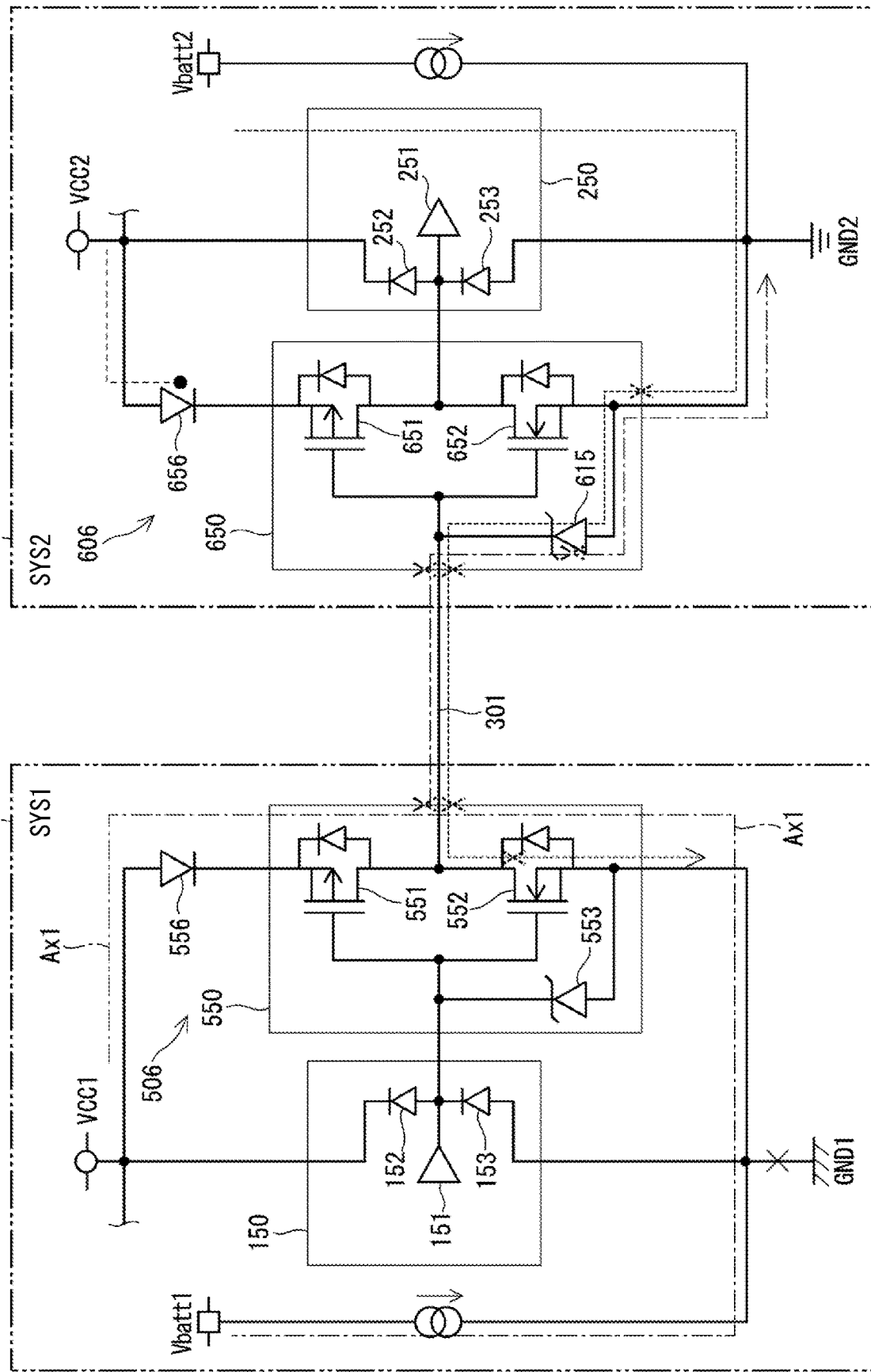
FIG. 12 is an explanatory diagram illustrating the sneak-in suppression circuit according to a sixth embodiment.

The sixth embodiment is shown in FIG. 12. The sneak-in suppression circuits 506 and 606 of the present embodiment are different from the sneak-in suppression circuits 505 and 605 of the fifth embodiment in that the diodes 557 and 657 are omitted therefrom. Note that, in FIG. 12, the description of the ground potential detection unit 580 is omitted.

In the present embodiment, when a ground abnormality is caused in the second system L2 on the input side, an electric current flows into the signal line 301 via the constant voltage diode 615. Even in such a situation, by devising a configuration that the breakdown voltage between the output and the ground of the logic IC 550 of the first system L1 is set to be a low value, for causing a short circuit of the FET 552, so as to melt and disconnect a bonding wire between the output of the logic IC 550 and the input of the logic IC 650, the cascading failure of the first system L1, which is a normal system, can be prevented.

Alternatively, if the logic IC 650 includes a plurality of CMOS logic circuits and exchanges a plurality of signals with the other system, by devising a configuration that a total electric current from all of the plurality of CMOS logic circuits flows to the second ground GND2 when the ground abnormality of the second ground GND2 is caused, so as to melt and disconnect the ground bonding wire of the logic IC 650, the cascading failure of the first system L1 is preventable.

Figure 16:
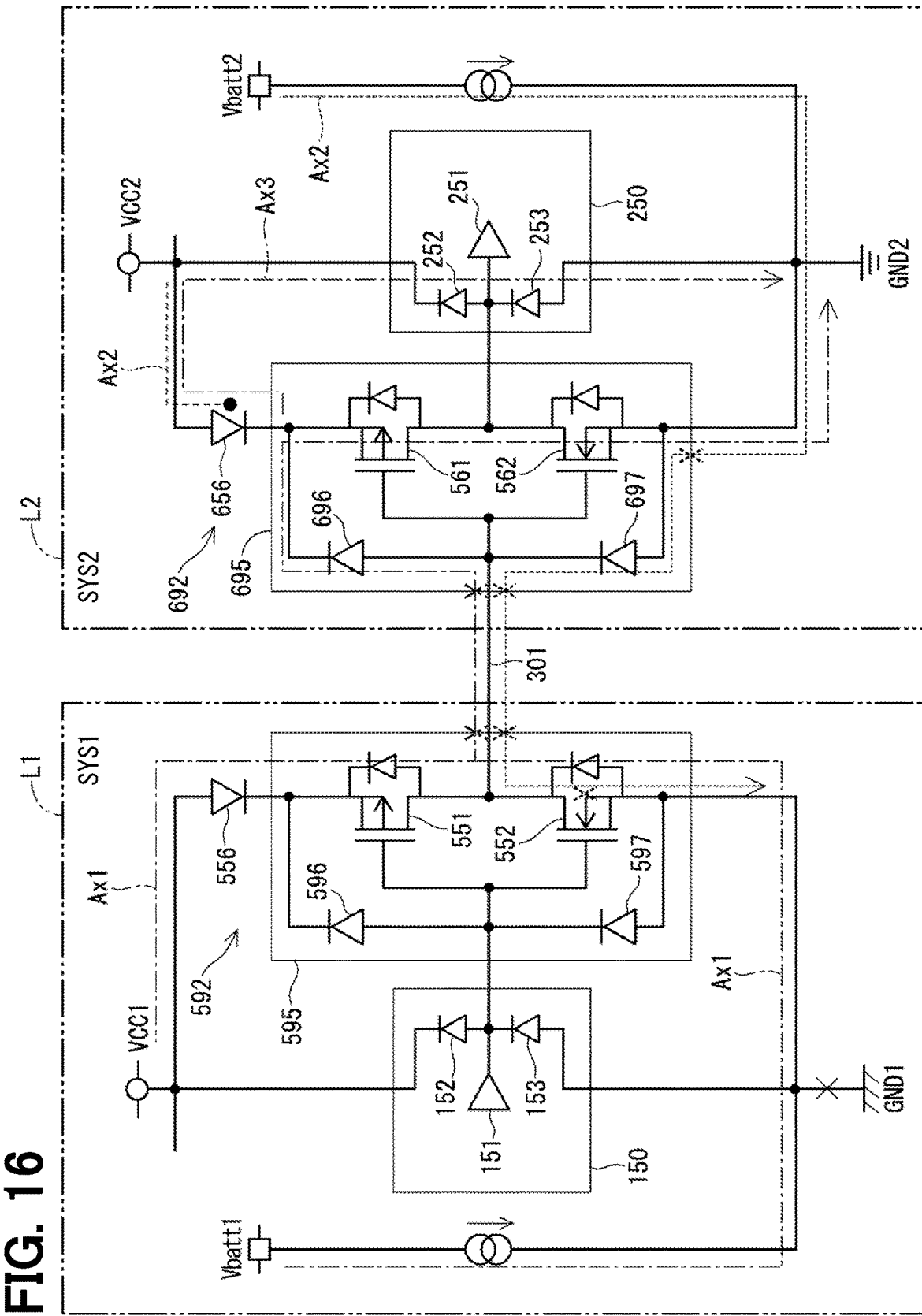
FIG. 16 is an explanatory diagram illustrating the sneak-in suppression circuit according to another reference example.

Sneak-in suppression circuits 592 and 692 of FIG. 16, providing another reference example, are different from the sneak-in suppression circuits 591 and 691 in that the diodes 557 and 658 are omitted therefrom. In the example of FIG. 16, when a ground abnormality is caused in the first ground GND1, due to the sneak current flowing from the first circuit power source 137 and the first ground GND1 to the second circuit power source 237 via the signal line 301, the voltage of the second circuit power source 237 may rise and may cause malfunction and/or breakdown of the elements connected to the second circuit power source 237. Note that, even if the diode 656 is provided for preventing such a failure, the simultaneous failure of both systems may still be caused if the breakdown voltage between the power source and the ground of the second system L2 (e.g., 6.5 to 10 [V]) is exceeded and an overcurrent due to a short circuit flows, which results in a voltage drop of the second circuit power source 237, thereby stopping the operation of the second system L2.

In the present embodiment, as shown in FIG. 12, the logic IC 650 is not provided with a diode 696 that connects the input side and the high potential side of the FET 651, thereby enabling disconnection of a path from the first system L1 to the second circuit power source 237. Then, as a failure mode, by devising a configuration of melting and disconnection of bonding of the input terminal of the logic IC 650 or the output terminal of the logic IC 550 due to an induction of a short circuit of the constant voltage diode 615 provided at a position between the input and the ground of the logic IC 650, the cascading failure of the second system L2, which is a normal system, can be prevented. The configuration described above also enables the effects similar to those of the embodiments described above.

Seventh Embodiment

Figure 13:
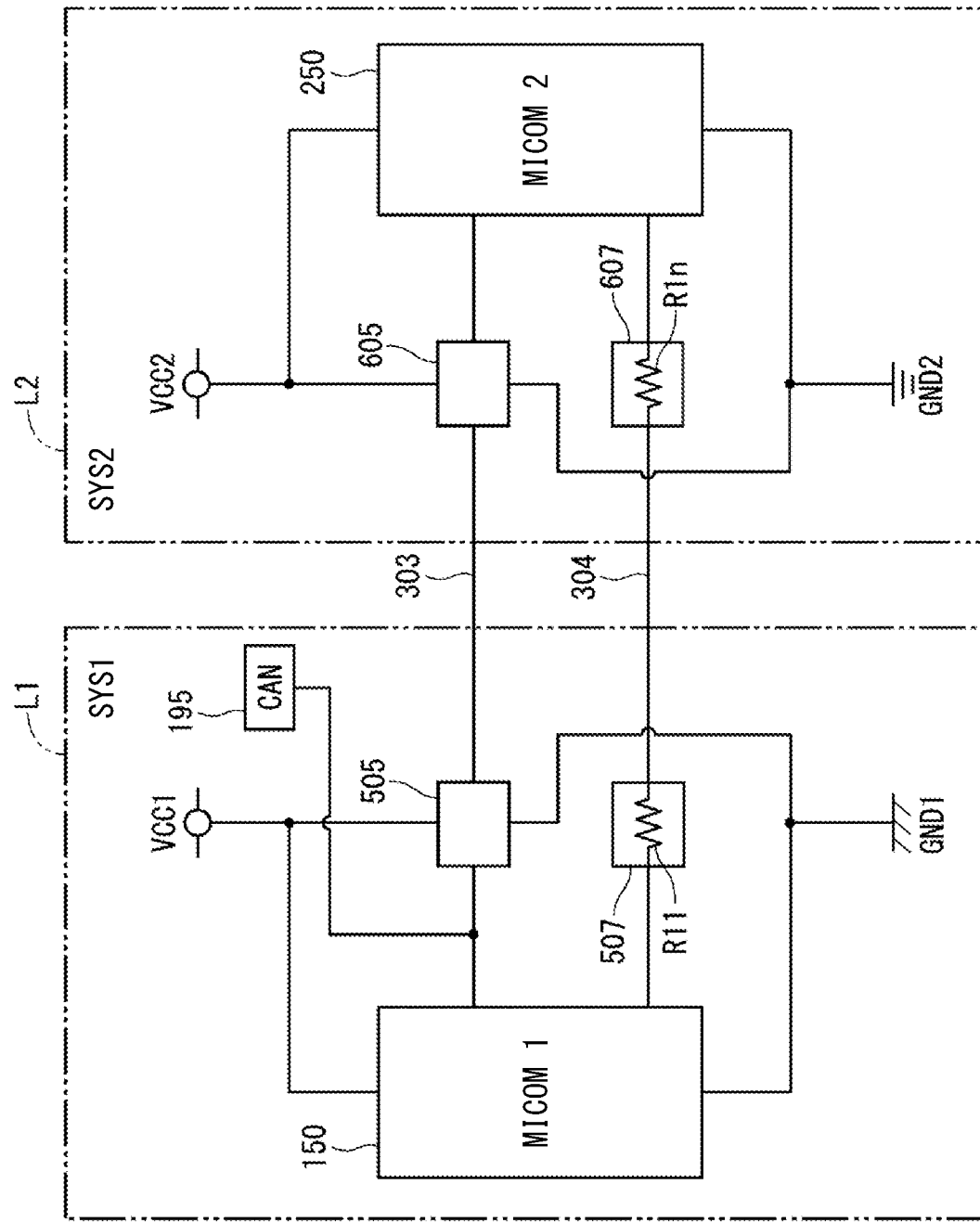
FIG. 13 is a block diagram illustrating the sneak-in suppression circuit according to a seventh embodiment.

The seventh embodiment is shown in FIG. 13. In the present embodiment, signal lines 303 and 304 connecting the control circuit units 150 and 250 are just the same as the signal line 301, i.e., shown as an example that the output side thereof connected to the first control circuit unit 150 and the input side thereof connected to the second control circuit unit 250. In the present embodiment, a high-speed signal line 303, which is a signal line required to be capable of performing communication at relatively high speed, is provided with the sneak-in suppression circuits 505 and 605 described in the fifth embodiment. The high-speed signal line 303 is a CAN signal line connected to the vehicle communication network 195, for example. In FIG. 13, descriptions of the vehicle communication circuits 111 and 211 and the communication terminals 108 and 208 are omitted.

On the other hand, compared to the signal line 303, a low-speed signal line 304, which performs communication at a relatively low speed, is provided with sneak-in suppression circuits 507 and 607. Similarly to the first embodiment, n pieces of resistor (i.e., n is an integer of 2 or more) are inserted in series in the low-speed signal line 304 as the sneak-in suppression circuits 507 and 607. In FIG. 13, resistors R11 and R1n are shown as representatives of the n pieces of resistor. By providing sneak-in suppression circuits according to the communication speeds, the configuration thereof can be simplified while satisfying the required communication speed.

Note that the sneak-in suppression circuit provided in the signal line that performs communication at relatively high speed may be provided as the same circuit as the fourth or sixth embodiment, and the sneak-in suppression circuit provided in the signal line that performs communication at relatively low speed may be provided as the same circuit as the second or third embodiment.

The ECU 10 of the present embodiment includes a plurality of control circuit units 150 and 250, a plurality of signal lines 303 and 304, and sneak-in suppression circuit 505, 507, 605, and 607. The control circuit units 150 and 250 are respectively connected to separate grounds. The signal lines 303 and 304 connect the first control circuit unit 150 and the second control circuit unit 250. The sneak-in suppression circuits 505, 507, 605, and 607 suppress the sneak-in of electric power from the ground of one system connected to the other system via the signal lines 303 and 304.

The sneak-in suppression circuits 505 and 605 provided in the high-speed signal line 303 that performs communication at relatively high speed, and the sneak-in suppression circuits 507 and 607 provided in the low-speed signal line 304 that performs communication at relatively low speed have respectively different configurations. More specifically, the sneak-in suppression circuits 505 and 605 provided in the high-speed signal line 303 include the logic ICs 550 and 650 that are respectively a logic circuit. The sneak-in suppression circuits 507 and 607 provided in the low-speed signal line 304 have n pieces of resistor (i.e., R11 to R1n) connected in series (i.e., n is an integer of 2 or more).

In such manner, the sneak-in suppression circuits 505, 605, 507, and 607 can be appropriately selected according to the required communication speed. In particular, a logic circuit is used for the sneak-in suppression circuits 505 and 506 of the high-speed signal line 303, and a plurality of resistors are inserted in series as the sneak-in suppression circuits 507 and 607 of the low-speed signal line 304, thereby, while satisfying the required communication speed, enabling suppression of the sneak-in electric power into the normal system when the ground abnormality is caused with the simplest possible configuration.

The ECU 10 controls the motor 80 mounted on a vehicle, and the high-speed signal line 303 is connected to the vehicle communication network 195 that performs communication with other control devices. Thereby, a sneak current can be appropriately suppressed while satisfying the communication speed requirement of the vehicle communication network 195.

Other Embodiments

In the above-described embodiments, a circuit using two or more resistors connected in series, a circuit using FET, and a circuit using a CMOS circuit are exemplified as the sneak-in suppression circuit provided in the signal line. In other embodiments, the sneak-in suppression circuit may have any circuit configuration as long as the sneak current of the electric power from the ground to the normal system can be suppressed when a ground abnormality is caused.

In the above embodiments, a motor winding, an inverter unit, and a control circuit unit are respectively provided in two sets. In other embodiments, three or more sets of motor winding, inverter unit, and control circuit unit may be provided and three or more systems may be configured. Also, a plurality of control units may be provided in one system, or one control unit may be provided with a plurality of drive circuits and winding sets. That is, number of components and control units may both be arbitrarily set. Further, one motor winding may be provided for a plurality of inverter units.

In the above embodiments, the rotating electric machine is a three-phase brushless motor. According to other embodiments, the rotating electric machine is not limited to the three phase brushless motor, but may be any type of motor. The rotating electric machine is not limited to a motor, but may be a generator, or may be a so-called motor-generator having both of a motor function and a generator function In the above embodiments, the electronic control unit is applied to the electric power steering apparatus. In other embodiments, the electronic control unit may be applied to other apparatuses other than the electric power steering apparatus. The present disclosure is not limited to the above embodiments, but may encompass various modifications thereof implementable without departing from the spirit of the disclosure.

What is claimed is:

1. An electronic control device comprising:
    a plurality of control circuit units connected to grounds separated from each other;
    a signal line connecting a first control circuit unit and a second control circuit unit; and
    a sneak-in suppression circuit configured to suppress a sneak-in of electric power from the ground of one system connected to the signal line to an other system, when defining a system as a component and a ground provided in combination with and corresponding to a control circuit unit,
    wherein
    the sneak-in suppression circuit includes a logic circuit, and
    the logic circuit is a CMOS circuit, and includes two field effect transistors, and a constant voltage diode provided at a position between (i) a gate signal line connected to two gates of the respective two field effect transistors and (ii) a source of one of the field effect transistors on a low potential side.

2. The electronic control device according to claim 1, wherein
    the sneak-in suppression circuit includes a diode provided at a position between the logic circuit and the ground of a subject system allowing energization only to a ground side.

3. The electronic control device according to claim 1, wherein
    at least a signal output side system is provided with a ground potential detection unit for detecting a value related to a ground potential, and
    the control circuit unit on the signal output side switches a signal output logic in accordance with a detection value of the ground potential detection unit.

4. The electronic control device according to claim 1, wherein
    the sneak-in suppression circuit has n pieces of resistor connected in series where n is an integer of 2 or more.

5. The electronic control device according to claim 4, wherein
at least one of the resistors on an output side is set to have a smaller resistance value than that of the resistors on an input side.

6. The electronic control device according to claim 1, wherein
the sneak-in suppression circuit is provided in a system on a signal input side and includes at least one field effect transistor.

7. The electronic control device according to claim 6, wherein
the field effect transistor is an n-channel type, and
the sneak-in suppression circuit includes a first resistor provided at a position between a gate of the field effect transistor and a ground of a subject system, and a second resistor provided at a position between a drain of the field effect transistor and a circuit power source of the subject system.

8. The electronic control device according to claim 6, wherein
the sneak-in suppression circuit includes a first resistor provided at a position between a gate of the field effect transistor and a circuit power source of a subject system, and a second resistor provided at a position between a drain of the field effect transistor and a ground of the subject system.

9. The electronic control device according to claim 6, wherein
the sneak-in suppression circuit includes the two field effect transistors,
one of the field effect transistors is a p-channel type provided on a high potential side,
an other field effect transistor is an n-channel type provided on a low potential side.

10. An electronic control device comprising:
a plurality of control circuit units connected to grounds separated from each other;
a plurality of signal lines connecting a first control circuit unit and a second control circuit unit; and
a sneak-in suppression circuit suppressing a sneak-in of electric power from the ground of one system connected to the signal line to an other system, when defining a system as a component and a ground provided in combination with and corresponding to a control circuit unit, wherein
a first sneak-in suppression circuit provided in a high-speed signal line that is a signal line for performing high-speed communication, and a second sneak-in suppression circuit provided in low-speed signal line that is a signal line for performing low-speed communication are different in configuration from each other.

11. The electronic control device according to claim 10, wherein
the first sneak-in suppression circuit provided in the high-speed signal line includes a logic circuit, and
the second sneak-in suppression circuit provided in the low-speed signal line has n pieces of resistor (n is an integer of 2 or more) connected in series.

12. The electronic control device according to claim 10, wherein
the electronic control device controls a rotating electric machine mounted on a vehicle, and
the high-speed signal line is connected to a vehicle communication network that performs communication with an other control device.

13. The electronic control device according to claim 1, wherein
at least one of the signal lines transmits and receives a binary value of on and off, and
the control circuit unit, outputting a signal of on and off when starting up a power source that supplies electric power to the control circuit unit, is capable of determining whether or not abnormality is caused in the sneak-in suppression circuit.

14. The electronic control device according to claim 10, wherein
at least one of the signal lines transmits and receives a binary value of on and off, and
the control circuit unit, outputting a signal of on and off when starting up a power source that supplies electric power to the control circuit unit, is capable of determining whether or not abnormality is caused in the sneak-in suppression circuit.

15. The electronic control device according to claim 1, wherein
at least one of the signal lines transmits and receives a pulsed signal.

16. The electronic control device according to claim 10, wherein
at least one of the signal lines transmits and receives a pulsed signal.

17. The electronic control device according to claim 15, wherein
the pulsed signal includes transmission data and check data for abnormality detection.

18. The electronic control device according to claim 16, wherein
the pulsed signal includes transmission data and check data for abnormality detection.

19. The electronic control device according to claim 1, wherein
a cathode of the constant voltage diode is connected to the gate signal line and the signal line.

20. The electronic control device according to claim 1, wherein
the gate signal line is connected directly to the two gates of the respective two field effect transistors.

* * * * *